(12) United States Patent
Ehrmann et al.

(10) Patent No.: US 9,436,095 B2
(45) Date of Patent: Sep. 6, 2016

(54) EXPOSURE APPARATUS AND MEASURING DEVICE FOR A PROJECTION LENS

(71) Applicant: Carl Zeiss SMT GmbH, Oberkochen (DE)

(72) Inventors: Albrecht Ehrmann, Aalen (DE); Ulrich Wegmann, Koenigsbronn (DE); Rainer Hoch, Aalen (DE); Joerg Mallmann, Boppard (DE); Karl-Heinz Schuster, Koenigsbronn (DE); Ulrich Loering, Schwaebisch Gmuend (DE); Toralf Gruner, Aalen-Hofen (DE); Bernhard Kneer, Altheim (DE); Bernhard Geuppert, Aalen (DE); Franz Sorg, Aalen (DE); Jens Kugler, Aalen (DE); Norbert Wabra, Werneck (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 505 days.

(21) Appl. No.: 13/682,474

(22) Filed: Nov. 20, 2012

(65) Prior Publication Data
US 2013/0120723 A1    May 16, 2013

Related U.S. Application Data

(63) Continuation of application No. 12/703,068, filed on Feb. 9, 2010, now Pat. No. 8,330,935, which is a
(Continued)

(51) Int. Cl.
*G03B 27/52* (2006.01)
*G03F 7/20* (2006.01)

(52) U.S. Cl.
CPC ......... *G03F 7/70341* (2013.01); *G03F 7/7085* (2013.01); *G03F 7/70591* (2013.01);
(Continued)

(58) Field of Classification Search
CPC .......... G03F 7/70341; G03F 7/70591; G03F 7/70691; G03F 7/7085; G03F 7/70875; G03F 7/70891; G03F 7/2041
USPC ......... 355/30, 52, 53, 55, 67–71, 72–75, 77; 250/492.1, 492.2, 492.22, 548; 430/5, 430/8, 22, 30, 311, 312, 321
See application file for complete search history.

(56) References Cited

U.S. PATENT DOCUMENTS 3,648,587 A * 3/1972 Stevens ............... G03F 7/70341
355/44
4,269,067 A    5/1981 Tynan et al.
(Continued)

FOREIGN PATENT DOCUMENTS

DE    221 563    9/1983
DE    224 448    3/1984
(Continued)

OTHER PUBLICATIONS

English translation of DD221563 A1, published on Apr. 24, 1985.*
(Continued)

*Primary Examiner* — Christina Riddle
(74) *Attorney, Agent, or Firm* — Fish & Richardson P.C.

(57) ABSTRACT

A microlithographic projection exposure apparatus includes a projection lens that is configured for immersion operation. For this purpose an immersion liquid is introduced into an immersion space that is located between a last lens of the projection lens on the image side and a photosensitive layer to be exposed. To reduce fluctuations of refractive index resulting from temperature gradients occurring within the immersion liquid, the projection exposure apparatus includes heat transfer elements that heat or cool partial volumes of the immersion liquid so as to achieve an at least substantially homogenous or at least substantially rotationally symmetric temperature distribution within the immersion liquid.

22 Claims, 10 Drawing Sheets

Related U.S. Application Data continuation of application No. 11/458,216, filed on Jul. 18, 2006, now abandoned, which is a continuation-in-part of application No. PCT/EP2005/000246, filed on Jan. 13, 2005.

(60) Provisional application No. 60/537,784, filed on Jan. 20, 2004.

(52) U.S. Cl.
CPC ....... *G03F 7/70691* (2013.01); *G03F 7/70875* (2013.01); *G03F 7/70891* (2013.01); *G03F 7/70991* (2013.01)

(56) References Cited

U.S. PATENT DOCUMENTS

| | | |
|---|---|---|
| 4,346,164 A | 8/1982 | Tabarelli et al. |
| 4,465,368 A | 8/1984 | Matsuura et al. |
| 4,480,910 A | 11/1984 | Takanashi et al. |
| 4,509,852 A | 4/1985 | Tabarelli et al. |
| 4,780,747 A | 10/1988 | Suzuki et al. |
| RE32,795 E | 12/1988 | Matsuura et al. |
| 5,220,171 A | 6/1993 | Hara et al. |
| 5,528,118 A | 6/1996 | Lee |
| 5,610,683 A | 3/1997 | Takahashi |
| 5,623,853 A | 4/1997 | Novak et al. |
| 5,715,039 A | 2/1998 | Fukuda et al. |
| 5,738,165 A | 4/1998 | Imai |
| 5,825,043 A | 10/1998 | Suwa |
| 5,850,280 A | 12/1998 | Ohtomo et al. |
| 5,864,386 A | 1/1999 | Nei |
| 5,874,820 A | 2/1999 | Lee |
| 5,969,441 A | 10/1999 | Loopstra et al. |
| 5,997,963 A | 12/1999 | Davison et al. |
| RE36,730 E | 6/2000 | Nishi |
| 6,191,429 B1 | 2/2001 | Suwa et al. |
| 6,228,544 B1 | 5/2001 | Ota |
| 6,341,007 B1 | 1/2002 | Nishi et al. |
| 6,483,569 B2 | 11/2002 | Ota |
| 6,590,634 B1 | 7/2003 | Nishi et al. |
| 6,611,316 B2 | 8/2003 | Sewell |
| 6,650,399 B2 | 11/2003 | Baselmans et al. |
| 6,721,034 B1 | 4/2004 | Horikawa |
| 6,721,039 B2 | 4/2004 | Ozawa |
| 6,778,257 B2 | 8/2004 | Bleeker et al. |
| 6,819,414 B1 | 11/2004 | Takeuchi |
| 6,897,963 B1 | 5/2005 | Taniguchi et al. |
| 7,227,616 B2 | 6/2007 | Graeupner |
| 8,330,935 B2 | 12/2012 | Ehrmann et al. |
| 2001/0043314 A1 | 11/2001 | Ota |
| 2002/0001088 A1 | 1/2002 | Wegmann et al. |
| 2002/0018189 A1 | 2/2002 | Mulkens et al. |
| 2002/0041377 A1 | 4/2002 | Hagiwara et al. |
| 2002/0061469 A1 | 5/2002 | Tanaka |
| 2002/0063856 A1 | 5/2002 | Inoue |
| 2002/0163629 A1 | 11/2002 | Switkes et al. |
| 2003/0030916 A1 | 2/2003 | Suenaga |
| 2003/0174408 A1 | 9/2003 | Rostalski et al. |
| 2003/0226951 A1 | 12/2003 | Ye et al. |
| 2004/0000627 A1 | 1/2004 | Schuster |
| 2004/0075895 A1 | 4/2004 | Lin |
| 2004/0109237 A1 | 6/2004 | Epple et al. |
| 2004/0114117 A1 | 6/2004 | Bleeker |
| 2004/0118184 A1 | 6/2004 | Violette |
| 2004/0119954 A1 | 6/2004 | Kawashima et al. |
| 2004/0125351 A1 | 7/2004 | Krautschik |
| 2004/0136494 A1 | 7/2004 | Lof et al. |
| 2004/0160582 A1 | 8/2004 | Lof et al. |
| 2004/0165159 A1 | 8/2004 | Lof et al. |
| 2004/0169834 A1 | 9/2004 | Richter et al. |
| 2004/0169924 A1 | 9/2004 | Flagello et al. |
| 2004/0180294 A1 | 9/2004 | Baba-Ali et al. |
| 2004/0180299 A1 | 9/2004 | Rolland et al. |
| 2004/0207824 A1* | 10/2004 | Lof .............. G03F 7/70341 355/30 |
| 2004/0211920 A1 | 10/2004 | Derksen et al. |
| 2004/0224265 A1 | 11/2004 | Endo et al. |
| 2004/0224525 A1 | 11/2004 | Endo et al. |
| 2004/0227923 A1 | 11/2004 | Flagello et al. |
| 2004/0253547 A1 | 12/2004 | Endo et al. |
| 2004/0253548 A1 | 12/2004 | Endo et al. |
| 2004/0257544 A1 | 12/2004 | Vogel et al. |
| 2004/0259008 A1 | 12/2004 | Endo et al. |
| 2004/0259040 A1 | 12/2004 | Endo et al. |
| 2004/0263808 A1 | 12/2004 | Sewell |
| 2005/0030506 A1 | 2/2005 | Schuster |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0036213 A1 | 2/2005 | Mann et al. |
| 2005/0037269 A1 | 2/2005 | Levinson |
| 2005/0042554 A1 | 2/2005 | Dierichs et al. |
| 2005/0046813 A1 | 3/2005 | Streefkerk et al. |
| 2005/0046934 A1 | 3/2005 | Ho et al. |
| 2005/0048223 A1 | 3/2005 | Pawloski et al. |
| 2005/0068499 A1 | 3/2005 | Dodoc et al. |
| 2005/0068639 A1 | 3/2005 | Pierrat et al. |
| 2005/0073670 A1 | 4/2005 | Carroll |
| 2005/0084794 A1 | 4/2005 | Meagley et al. |
| 2005/0094116 A1 | 5/2005 | Flagello et al. |
| 2005/0094125 A1 | 5/2005 | Arai |
| 2005/0100745 A1 | 5/2005 | Lin et al. |
| 2005/0110973 A1 | 5/2005 | Streefkerk et al. |
| 2005/0117224 A1 | 6/2005 | Shafer et al. |
| 2005/0122497 A1 | 6/2005 | Lyons et al. |
| 2005/0132914 A1 | 6/2005 | Mulkens et al. |
| 2005/0134815 A1 | 6/2005 | Van Santen et al. |
| 2005/0141098 A1 | 6/2005 | Schuster |
| 2005/0145803 A1 | 7/2005 | Hakey et al. |
| 2005/0146694 A1 | 7/2005 | Tokita |
| 2005/0146695 A1 | 7/2005 | Kawakami |
| 2005/0147920 A1 | 7/2005 | Lin et al. |
| 2005/0153424 A1 | 7/2005 | Coon |
| 2005/0158673 A1 | 7/2005 | Hakey et al. |
| 2005/0164502 A1 | 7/2005 | Deng et al. |
| 2005/0174549 A1 | 8/2005 | Duineveld et al. |
| 2005/0174550 A1 | 8/2005 | Streefkerk et al. |
| 2005/0175940 A1 | 8/2005 | Dierichs |
| 2005/0179877 A1 | 8/2005 | Mulkens et al. |
| 2005/0185269 A1 | 8/2005 | Epple et al. |
| 2005/0190435 A1 | 9/2005 | Shafer et al. |
| 2005/0190455 A1 | 9/2005 | Rostalski et al. |
| 2005/0205108 A1 | 9/2005 | Chang et al. |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2005/0219490 A1 | 10/2005 | Owa |
| 2005/0225737 A1 | 10/2005 | Weissenrieder et al. |
| 2005/0243328 A1 | 11/2005 | Wegmann et al. |
| 2005/0264780 A1 | 12/2005 | Graeupner |
| 2005/0270505 A1 | 12/2005 | Smith |
| 2006/0001851 A1 | 1/2006 | Grant et al. |
| 2006/0007415 A1 | 1/2006 | Kosugi et al. |
| 2006/0033892 A1 | 2/2006 | Cadee et al. |
| 2006/0061747 A1 | 3/2006 | Ishii |
| 2006/0082744 A1 | 4/2006 | Hirukawa |
| 2006/0152698 A1 | 7/2006 | Ishii |
| 2006/0187432 A1 | 8/2006 | Yasuda et al. |
| 2006/0268249 A1 | 11/2006 | Kameyama |
| 2007/0070316 A1 | 3/2007 | Ehrmann et al. |
| 2008/0106707 A1 | 5/2008 | Kobayashi et al. |
| 2008/0309894 A1 | 12/2008 | Ehrmann et al. |
| 2009/0115977 A1 | 5/2009 | Nagasaka et al. |
| 2009/0135385 A1 | 5/2009 | Gellrich et al. |
| 2010/0141912 A1 | 6/2010 | Ehrmann et al. |

FOREIGN PATENT DOCUMENTS

| | | |
|---|---|---|
| DE | 101 09 929 | 11/2001 |
| DE | 103 01 799 | 4/2004 |
| DE | 102 61 775 | 7/2004 |
| EP | 0 357 423 | 3/1990 |
| EP | 0 823 662 | 2/1998 |
| EP | 1 041 357 | 10/2000 |

(56) References Cited

FOREIGN PATENT DOCUMENTS

| | | |
|---|---|---|
| EP | 1 369 743 | 12/2003 |
| EP | 1 420 298 | 5/2004 |
| EP | 1 498 781 | 1/2005 |
| EP | 1 524 558 | 4/2005 |
| EP | 1524558 | 4/2005 |
| EP | 1 624 481 | 2/2006 |
| EP | 1 628 330 | 2/2006 |
| EP | 1 672 680 | 6/2006 |
| EP | 1 677 341 | 7/2006 |
| EP | 1 843 384 | 10/2007 |
| JP | 57-117238 | 7/1982 |
| JP | 57-152129 | 9/1982 |
| JP | 57-153433 | 9/1982 |
| JP | 58-202448 | 11/1983 |
| JP | 59-019912 | 2/1984 |
| JP | 62-65326 | 3/1987 |
| JP | 63-157419 | 6/1988 |
| JP | 3-3222 | 1/1991 |
| JP | 4-305915 | 10/1992 |
| JP | 4-305917 | 10/1992 |
| JP | 05-021314 | 1/1993 |
| JP | 5-62877 | 3/1993 |
| JP | 6-29204 | 2/1994 |
| JP | 6-124873 | 5/1994 |
| JP | 7-220990 | 8/1995 |
| JP | 08-130179 | 5/1996 |
| JP | 8-316125 | 11/1996 |
| JP | 8-330224 | 12/1996 |
| JP | 09-232213 | 9/1997 |
| JP | 10-154659 | 6/1998 |
| JP | 10-163099 | 6/1998 |
| JP | 10-214783 | 8/1998 |
| JP | 10-255319 | 9/1998 |
| JP | 10-303114 | 11/1998 |
| JP | 10-340846 | 12/1998 |
| JP | 11-016816 | 1/1999 |
| JP | 11-135400 | 5/1999 |
| JP | 11-176727 | 7/1999 |
| JP | 2000-58436 | 2/2000 |
| JP | 2000-505958 | 5/2000 |
| JP | 2000-164504 | 6/2000 |
| JP | 2001-510577 | 7/2001 |
| JP | 2001-267239 | 9/2001 |
| JP | 2002-005586 | 1/2002 |
| JP | 2002-014005 | 1/2002 |
| JP | 2002-071514 | 3/2002 |
| JP | 2002-198303 | 7/2002 |
| JP | 2002-231622 | 8/2002 |
| JP | 2004-519850 | 7/2004 |
| JP | 2005-012201 | 1/2005 |
| JP | 2005-051231 | 2/2005 |
| JP | 2005-136404 | 5/2005 |
| JP | 2006-024915 | 1/2006 |
| JP | 2006-165500 | 6/2006 |
| KR | 10-2004-0044119 | 5/2004 |
| NL | WO 2004057589 A1 * | 7/2004 ......... G03F 7/70341 |
| WO | WO 99/60361 | 1/1999 |
| WO | WO 99/23692 | 5/1999 |
| WO | WO 99/28790 | 6/1999 |
| WO | WO 99/49404 A1 | 9/1999 |
| WO | WO 99/49504 | 9/1999 |
| WO | WO 01/35168 | 5/2001 |
| WO | WO 02/091078 A1 | 11/2002 |
| WO | WO 03/077037 A1 | 9/2003 |
| WO | WO 03/079418 | 9/2003 |
| WO | WO 2004/019128 A2 | 3/2004 |
| WO | WO 2004/053596 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004093159 A2 * | 10/2004 ......... G03F 7/2041 |
| WO | WO 2004/095135 A2 | 11/2004 |
| WO | WO 2004/107417 | 12/2004 |
| WO | WO 2005/001432 A2 | 1/2005 |
| WO | WO 2005/003864 A2 | 1/2005 |
| WO | WO 2005/006026 A2 | 1/2005 |
| WO | WO 2005/008339 A1 | 1/2005 |
| WO | WO 2005/013008 A2 | 2/2005 |
| WO | WO 2005/015283 A2 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/029559 | 3/2005 |
| WO | WO 2005/034174 A2 | 4/2005 |
| WO | WO 2005/038888 | 4/2005 |
| WO | WO 2005/050324 A2 | 6/2005 |
| WO | WO 2005/054953 A2 | 6/2005 |
| WO | WO 2005/054955 A2 | 6/2005 |
| WO | WO 2005/059617 A2 | 6/2005 |
| WO | WO 2005/059618 A2 | 6/2005 |
| WO | WO 2005/059645 A2 | 6/2005 |
| WO | WO 2005/059654 A2 | 6/2005 |
| WO | WO 2005/062128 A2 | 7/2005 |
| WO | WO 2005/064400 A2 | 7/2005 |
| WO | WO 2005/064405 A2 | 7/2005 |
| WO | WO 2005/069055 A2 | 7/2005 |
| WO | WO 2005/069078 A1 | 7/2005 |
| WO | WO 2005/069081 A2 | 7/2005 |
| WO | WO 2005/071491 A2 | 8/2005 |
| WO | WO 2005/074606 A2 | 8/2005 |
| WO | WO 2005/076084 A1 | 8/2005 |
| WO | WO 2005/081030 A1 | 9/2005 |
| WO | WO 2005/081067 A1 | 9/2005 |
| WO | WO 2006/059636 | 6/2006 |

OTHER PUBLICATIONS

B.J. Lin, "Semiconductor Foundry, Lithography, and Partners", Emerging Lithographic Technologies VI, Proceedings of SPIE, vol. 4688 (2002), pp. 11-24.

M. Switkes et al., "Resolution Enhancement of 157 nm Lithography by Liquid Immersion," Optical Microlithography XV, Proceedings of SPIE, vol. 4691 (2002), pp. 459-465.

M. Switkes et al., "Resolution Enhancement of 157 nm Lithography by Liquid Immersion," J. Microlith., Microfab., vol. 1, No. 3, Oct. 2002, Society of Photo-Optical Instrumentation Engineers, pp. 225-228.

Soichi Owa et al., "Nikon F2 Exposure Tool," Nikon Corporation, 3$^{rd}$ 157 nm symposium, Sep. 4, 2002, 25 pages (slides 1-25).

Immersion Lithography Workshop, Nikon Corporation, Dec. 11, 2002, 24 pages (slides 1-24).

Soichi Owa et al , "Immersion lithography; its potential performance and issues," Optical Microlithography XVI, Proceedings of SPIE vol. 5040 (2003), pp. 724-733.

Soichi Owa et al., "Update on 193 nm immersion exposure tool," Nikon Corporation, Immersion Workshop, Jan. 27, 2004, 38 pages (slides 1-38).

Soichi Owa et al., "Update on 193 nm immersion exposure tool," Nikon Corporation, Litho Forum, Jan. 28, 2004, 51 pages (slides 1-51).

Soichi Owa et al., "Potential performance and feasibility of immersion lithography," Nikon Corporation, NGL Workshop, Jul. 10, 2003, 33 pages (slides 1-33).

Masaomi Kameyama, "Present Status of Immersion Lithography," Technology Symposium, SEMI (Semiconductor Equipment and Materials International), Dec. 4, 2003.

Masaomi Kameyama, "Immersion Lithography and NGL," The Society of Polymer Science, Japan, Jan. 20, 204.

*Shafer et al.* v. *Omura*, "Shafer Motions List, " for Patent Interference No. 105,678 (SCM), filed Mar. 25, 2009 with the United States Patent and Trademark Office before the Board of Patent Appeals and Interferences (13 pages).

(56) References Cited

OTHER PUBLICATIONS

*Shafer et al.* v. *Omura*, "Judgment—Request for Adverse—Bd.R. 127(b)," for Patent Interference No. 105,678 (SCM), filed Aug. 31, 2009 with the United States Patent and Trademark Office before the Board of Patent Appeals and Interferences (3 pages).

International Search Report for U.S. National Phase Application No. PCT/JP2006/308040, mailed Jul. 18, 2006, including Translation.

Korean Office Action, with English translation, for KR Application No. 10-2006-7014453, dated May 2, 2011.

English translation of WO 99/49504, published Sep. 30, 1999.

* cited by examiner

EXPOSURE APPARATUS AND MEASURING DEVICE FOR A PROJECTION LENS

CROSS-REFERENCE TO RELATED APPLICATIONS

This application is a continuation of U.S. application Ser. No. 12/703,068, filed Feb. 9, 2010, now U.S. Pat. No. 8,330,935, which is a continuation of U.S. application Ser. No. 11/458,216, filed Jul. 18, 2006, now abandoned, which is a continuation-in-part of International Patent Application PCT/EP2005/000246, which was filed on Jan. 13, 2005 and claims benefit of U.S. provisional Application No. 60/537,784 filed Jan. 20, 2004. The full disclosure of these earlier applications is incorporated herein by reference.

BACKGROUND OF THE INVENTION

1. Field of the Invention

The invention relates to microlithographic projection exposure apparatuses as used for manufacturing highly-integrated electrical circuits and other microstructured components. In particular, the invention relates to projection exposure apparatuses configured for immersion operation. The invention further provides measuring devices for determining the imaging properties of projection lenses.

2. Description of Related Art

Integrated electrical circuits and other microstructured components are usually manufactured by applying a plurality of structured layers to a suitable substrate, which may be, for example, a silicon wafer. To structure the layers, they are first covered with a photoresist that is sensitive to light of a given wavelength range, e.g. light in the deep ultraviolet (DUV) spectral range. The coated wafer is then exposed in a projection exposure apparatus. A pattern composed of structures located on a mask is imaged on the photoresist by means of a projection lens. Because the imaging scale is generally less than 1:1, such projection lenses are frequently referred to as reduction lenses.

After the photoresist has been developed the wafer is subjected to an etching or deposition process whereby the uppermost layer is structured according to the pattern on the mask. The remaining photoresist is then removed from the remaining parts of the layer. This process is repeated until all the layers have been applied to the wafer.

One of the primary design objectives in the development of projection exposure apparatuses is to be able to lithographically define structures of increasingly small dimensions. Small structures lead to high integration densities, which generally have a favourable effect on the efficiency of microstructured components manufactured using such apparatuses.

The size of the definable structures depends, above all, on the resolution of the projection lens used. Because the resolution of projection lenses improves as the wavelength of the projection light becomes shorter, one approach to decrease the resolution is to use projection light having shorter and shorter wavelengths. The shortest wavelengths currently used are 193 nm and 157 nm, i.e. in the deep ultraviolet (DUV) spectral range.

Another approach to decrease the resolution is based on the concept of introducing an immersion liquid having a high refractive index into the space located between a last lens of the projection lens on the image side and the photoresist or another photosensitive layer to be exposed. Projection lenses, which are designed for immersion operation and are therefore also referred to as immersion lenses, can attain numerical apertures of greater than 1, e.g. 1.3 or 1.4. However, immersion not only makes possible high numerical apertures and therefore an improved resolution, but also has a favorable effect on depth of focus. The greater the depth of focus, the less high are the demands for precise positioning of the wafer in the image plane of the projection lens.

A projection exposure apparatus designed for immersion operation is known from U.S. Pat. No. 4,346,164 A. To accommodate a wafer, this known projection exposure apparatus has an upwardly open container with an upper edge that is located higher than the lower boundary face of the last lens of the projection lens on the image side. Inlet and outlet pipes for an immersion liquid open into the container. These pipes are connected to a pump, a temperature-stabilizing device and a filter for cleaning the immersion liquid. During operation of the projection exposure apparatus, the immersion liquid is circulated in a loop. An immersion space located between the lower boundary face of the last lens of the projection lens on the image side and the semiconductor slice to be exposed remains filled the immersion liquid.

A projection exposure apparatus having an immersion arrangement is also known from WO 99/49504. In this projection exposure apparatus the supply and discharge pipes for the immersion liquid open directly onto the lower boundary face of the last lens of the projection lens on the image side. The use, in particular, of a plurality of such supply and discharge pipes, which may be arranged, for example, in a ring around the last lens on the image side, makes it possible to dispense with a surrounding container. This is because immersion liquid is sucked away as it runs off laterally and is fed back in such a way that the immersion space between the last lens on the image side and the photosensitive surface always remains filled with immersion liquid.

A difficulty with the immersion operation of projection exposure apparatuses is to keep the optical characteristics of the immersion liquid constant, at least where the liquid is exposed to the projection light. Special attention must be paid to the absorption and the refractive index of the immersion liquid. Local fluctuations in the absorption, as can be produced, for example, by impurities, lead to undesired intensity fluctuations in the image plane. As a result, line width fluctuations may occur even if the imaging is otherwise free of substantial aberrations.

Local fluctuations in the refractive index of the immersion liquid have an especially detrimental effect, since such fluctuations directly impair the imaging characteristics of the projection exposure apparatus. If the refractive index of the immersion liquid is inhomogeneous within the volume of the immersion liquid exposed to the projection light, this causes distortions of the wave fronts passing through the immersion space. For example, points in the object plane of the projection lens may no longer be imaged sharply on the image plane.

The refractive index of liquids is dependent on their density. Because liquids are virtually incompressible, their density is practically independent of static pressure and depends almost exclusively on the temperature of the liquids. For this reason, the immersion liquid inside the immersion space that is exposed to the projection light can have a homogeneous refractive index only if the temperature of the immersion liquid is constant therein.

Moreover, temperature fluctuations within the immersion liquid not only cause fluctuations of refractive index, but can also cause adjacent optical elements, in particular the last optical element of the projection lens on the image side, to be heated unevenly and therefore to be deformed in a manner that can hardly be corrected.

The causes that give rise to inhomogeneities of the temperature in the immersion space are diverse. A major cause for heating the immersion liquid is the absorption of projection light by the immersion liquid. Even if only a small percentage of the projection light is absorbed by the immersion liquid, this causes a comparatively high heat input because of the short-wave and therefore energy-rich projection light. An effect which leads to cooling of the immersion liquid is the evaporation of immersion liquid at the boundary surface to a surrounding gas. In addition, the temperature of the immersion liquid is influenced by heat transitions from and to surrounding solid bodies. These bodies may be, for example, a heated last lens of the projection lens, its housing or the wafer to be exposed.

To homogenize the temperature, it has been proposed hitherto to circulate the immersion liquid in a circuit and to establish a desired reference temperature by means of a temperature-stabilizing device. However, the homogenization of temperature distribution that can be achieved in this way is frequently not sufficient. Relatively high flow velocities, which may lead to disturbing vibrations, are usually required. In addition, high flow velocities promote the formation of gas bubbles which can also adversely affect the imaging properties.

Moreover, similar difficulties also arise in measuring devices with which the imaging characteristics of such projection lenses can be determined. If immersion lenses having numerical apertures of greater than 1 are to be measured, it is also necessary to introduce an immersion liquid into an immersion space located between the last optical element of the projection lens on the image side and a test optics component of the measuring device. Because of the extremely high demands on the measuring accuracy of such devices, inhomogeneities of refractive index within the immersion liquid cannot be tolerated.

SUMMARY OF THE INVENTION

It is therefore the object of the invention to improve a projection exposure apparatus, and a measuring device for the optical measurement of projection lenses, such that imaging defects resulting from inhomogeneities of the refractive index within the immersion liquid are reduced.

This object is achieved in that the projection exposure apparatus and the measuring device include a heat transfer element with which the temperature can be changed in a specified manner in a partial volume of the immersion space.

The invention is based on the discovery that a desired temperature distribution within the immersion space can be attained if heat is supplied to or extracted from the immersion liquid in a spatially specified manner. It is known in general where and to what degree heat is transferred into the immersion liquid or dissipated therefrom to surrounding media. If these causes of temperature fluctuations are carefully analyzed, it is possible to determine the temperature distribution which the immersion liquid inside the volume of the immersion space through which projection light passes can be expected to have, if no additional measures are taken to change the temperature distribution. On the basis of the anticipated temperature distribution it can then be determined at which locations heat must be supplied or extracted so that the desired temperature distribution is established. In general, the aim is to achieve a homogenous temperature distribution. However, consideration may also be given to establishing a temperature distribution which, although inhomogeneous, has a certain symmetry. For example, with a rotationally symmetrical temperature distribution the immersion liquid would not be free from refractive power but could have the effect of an index lens.

Because of the local heating or cooling of the immersion liquid according to the invention, continuous circulation of the immersion liquid in a circuit including a temperature-stabilizing arrangement may be dispensed with, if desired. In this way vibrations produced by the circulation of the immersion liquid are avoided, as is particularly advantageous in the case of measuring devices. If the immersion liquid is not to be completely exchanged at regular intervals, consideration may be given to a discontinuous circulation. This means that the immersion liquid is circulated by means of a pump, while being cleaned and optionally additionally cooled or heated, only during exposure or measuring pauses. With regard to the avoidance of vibration, such discontinuous circulation may be advantageously used even independently of the heat transfer element according to the invention.

If a homogeneous temperature distribution is desired, this will generally result in the heat transfer elements being arranged with a symmetry corresponding to that of the immersion space. Rotationally symmetrical arrangements of the heat transfer elements are therefore preferred. In the case of slit-shaped light fields, as are projected onto the wafer with projection exposure apparatuses designed for scanning operation, for example, the heat transfer elements may also be arranged differently, e.g. corresponding to the geometry of the light fields.

As a heat transfer element, any body that is suited to exchanging heat with the immersion liquid by way of thermal conduction or radiation is in principle possible. Depending on whether heat passes from the heat transfer element to the immersion liquid or vice versa, local heating or cooling of the immersion liquid occurs.

The heat transfer element may be arranged, for example, inside the immersion space, so that it comes into contact with the immersion liquid during immersion operation. In the simplest case, the heat transfer element is then an electrically heatable heating wire which is preferably covered with an electrically insulating and chemically protective layer. Such a heating wire has the advantage that it can be given practically any desired shape. As a result, heat can be supplied to the immersion liquid at any desired location inside the immersion space but outside the volume through which the projection light passes.

Because the projection light generally produces a relatively large heat input due to absorption, the heating wire may be arranged, for example, in an annular configuration around the volume through which projection light passes. The calorific output is then preferably selected such that the temperature gradient in the volume through which projection light passes is minimized.

A still more precisely specified heat input is possible if, as an additional parameter, the wire diameter is varied. In this way the calorific output can also be varied along the longitudinal extension of the heating wire.

Instead of an electrically heatable heating wire, a conduit through which a fluid heating medium flows, e.g. heated or cooled water, may also be used as a heat transfer element. In this case, too, the heating or cooling power can be varied in the longitudinal direction of the conduit by varying the flow cross-section.

If the immersion liquid is prevented from escaping by a wall laterally bordering the immersion space, the heat transfer element may also be arranged in this wall. Also in this case a configuration of the heat transfer element as an electrically heatable heating wire or a conduit through which a heating medium can flow is contemplated. In this way the wall itself forms, so to speak, a single large heat transfer element.

For locally cooling the immersion liquid a Peltier element may be used as heat transfer element.

In an particularly advantageous embodiment, the heat transfer element is spaced from the immersion space in such a way that heat can be exchanged between the heat transfer element and the partial volume by thermal radiation, e.g. by infrared or microwave radiation. In this case the heat transfer element may be, for example, in the form of a preferably electrically heatable or coolable planar radiator. Heat transfer by radiation has the advantage over heat transfer by conduction that no direct physical contact between the heat transfer element and the immersion liquid is required. The heat transfer element can therefore be arranged at a greater distance from the immersion liquid. In this embodiment, possible difficulties arising through the installation of heat transfer elements in the narrow immersion space or adjacently thereto are avoided.

In order to direct the thermal radiation more selectively from a heat transfer element to the immersion liquid in this embodiment, one or more optical elements, for example mirrors or lenses, which change the direction of the thermal radiation may be arranged between the heat transfer element and the immersion space. By using optical elements having positive refractive power, thermal radiation can be focused in a specified manner into the narrow gap between the projection lens and the wafer and onto the desired partial volume of the immersion space.

In principle, it is even possible to arrange one or more of these optical elements inside the projection lens in order to direct thermal radiation onto the desired partial volume of the immersion space. It is also possible in this case to couple thermal radiation into the beam path of the projection lens in such a way that said thermal radiation exits the last lens of the projection lens on the image side separately from the projection light. With a suitably selected beam path, the thermal radiation heats exclusively a partial volume of the immersion liquid which surrounds the volume through which the projection light passes, thus reducing the temperature gradient at the edge of this volume. It must then be ensured only that the thermal radiation has a wavelength to which the photoresist is insensitive.

To measure the temperature in the immersion liquid in a contactless manner, the temperature of a heat transfer element may be determined, wherein the temperature of the heat transfer element can be changed only by exchange of thermal radiation with the immersion liquid. Under these conditions, given a known calorific output and temperature of the heat transfer element, conclusions may be drawn regarding the temperature of the immersion liquid. To measure the temperature of such a heat transfer element, it may be connected to a thermal sensor. The latter may in turn be in signalling connection to a control device which regulates the heating or cooling output of the heat transfer element.

In the case of projection exposure apparatuses which are not operated in scanning mode but step-by-step, a wafer stage, on which the carrier of the photosensitive layer can be fixed, may be considered as a location for mounting a heat transfer element according to the invention. In this way the carrier may be locally heated or cooled from below. Thus, the temperature of the immersion liquid located above the carrier can also be changed by thermal conduction. This configuration also provides a possibility of cooling the volume of immersion liquid exposed to the projection light. Other cooling measures are in general difficult because this volume is not easily accessible either from above or from the side.

According to another aspect of the invention, the above-mentioned object is achieved in that an evaporation barrier, which at least partially surrounds the immersion space, is arranged on an underside of the projection lens facing towards the photosensitive layer.

According to this second aspect of the invention, one of the major causes leading to the formation of temperature gradients in the immersion space is largely eliminated. The evaporation barrier prevents immersion liquid from evaporating to a large extent into a surrounding gas volume.

For this purpose the evaporation barrier may include, for example, one or more at least approximately concentric rings having, for example, a circular or polygonal shape, which are arranged at a distance from one another. In this way the boundary surface to the surrounding gas is reduced so that less immersion liquid can evaporate.

According to a further aspect of the invention the evaporation of immersion liquid is wholly or at least partially prevented in that an outer chamber surrounding the immersion space and in fluid connection therewith can be enriched with a vapor phase of the immersion liquid.

Through the enrichment of this outer chamber with a vapor phase of the immersion liquid the vapor pressure in the outer chamber can be increased until hardly any immersion liquid can pass from the liquid phase to the vapor phase. In the ideal case, the pressure of the vapor phase in the outer chamber is adjusted such that it at least approximately equals the saturation vapor pressure of the vapor phase at the temperature prevailing in the outer chamber. In this case, exactly the same amount of immersion liquid evaporates at the boundary surface between the immersion liquid and the vapor phase as simultaneously condenses from the vapor phase. As a result of this equilibrium, the temperature of the immersion liquid in proximity to the boundary surface remains unchanged.

To producing a vapor phase of the immersion liquid in the outer chamber, a supply device for introducing a vapor phase of the immersion liquid into the outer chamber may be provided.

The embodiments explained below can be advantageously used with all the above aspects of the invention and even independently thereof.

The feed pipes for the immersion liquid are normally firmly connected, e.g. clamped or press-fitted, to a wall delimiting the immersion space laterally and downwardly. This may transfer vibrations from outside to the immersion liquid. To avoid such vibrations, in particular with measuring devices, an aperture for a pipe leading into the immersion space may be provided in such a wall. The dimensions of the aperture are sufficiently larger than the external dimensions of the pipe so that immersion liquid can enter a gap remaining between the pipe and the wall, but cannot flow out of said gap as a result of adhesion forces. The adhesion forces therefore effect a seal of the wall in the region of the aperture although the pipe is longitudinally displaceable therein. A transmission of vibrations from the pipe to the wall and from there to the immersion liquid is considerably reduced by the liquid-filled gap.

In addition, it is advantageous if a detector for detecting immersion liquid is provided. In particular with projection exposure apparatuses or measuring devices in which the immersion liquid is not delimited laterally by a ring or a container, it is frequently necessary to ascertain whether immersion liquid is still present inside the region provided therefore or has left this region, e.g. as a result of inertial forces.

It may be possible to determine, with the help of the detector, whether immersion liquid leaves a predefined closed surface. This closed surface is preferably a surface on the photosensitive layer immediately below the projection lens.

Such a detector may be realized, for example, in that two substantially parallel conductors, preferably placed around the closed surface in the manner of the loop, form a capacitor. If immersion liquid enters the space between the conductors, this causes an increase in the dielectric constant, whereby the capacitance of the capacitor is increased. This increase in capacitance can be detected in a simple manner with a suitable measuring circuit, known per se, for measuring capacitance.

The embodiments of the invention explained above have been explained predominantly with reference to a projection exposure apparatus. However, they can be used equally advantageously with measuring devices for determining imaging characteristics, since a measuring assembly for measuring a projection lens differs only slightly from a projection exposure apparatus. For example, measuring devices also include a type of illumination system which generates measuring light and couples it into the projection lens. If no photosensitive test layer is exposed during measurement, the immersion space is delimited downwardly by a test optics component. With a Twyman-Green or Fizeau interferometer, for example, this test optics component may be a mirror; with a Moiré or Shearing interferometer it may be a diffraction grating, and with a Hartmann-Shack sensor it may be a grid-of-points mask.

If an immersion liquid is introduced into the gap between the last optical element of the projection lens on the image side and such a test optics component, temperature stabilization of this immersion liquid is also required. Because the test optics component—unlike the wafer in a projection exposure apparatus designed for scanning operation—generally does not move within the image plane, the immersion liquid in the immersion space is not mixed as a result of such movements, so that still higher temperature gradients can develop. On the other hand, some of the above-mentioned measures are especially suited to such measuring devices, since design difficulties arising as a result of scanning motion do not occur in their case.

Such a stationary test optics component delimiting the immersion space downwardly enables heat to be dissipated in a specified manner via the test optics component. If, for example, the test optics component includes a zone which is at least partially transparent to light and if this zone is at least partially surrounded by another zone, this other zone may be made of a material which has higher thermal conductivity than the material of which the light-transparent zone consists. An example is a glass/metal material combination. The metal surrounding the glass zone ensures efficient heat dissipation for the immersion liquid located above same.

BRIEF DESCRIPTION OF THE DRAWINGS

Various features and advantages of the present invention may be more readily understood with reference to the following detailed description taken in conjunction with the accompanying drawing in which.

DESCRIPTION OF PREFERRED EMBODIMENTS

Figure 1:
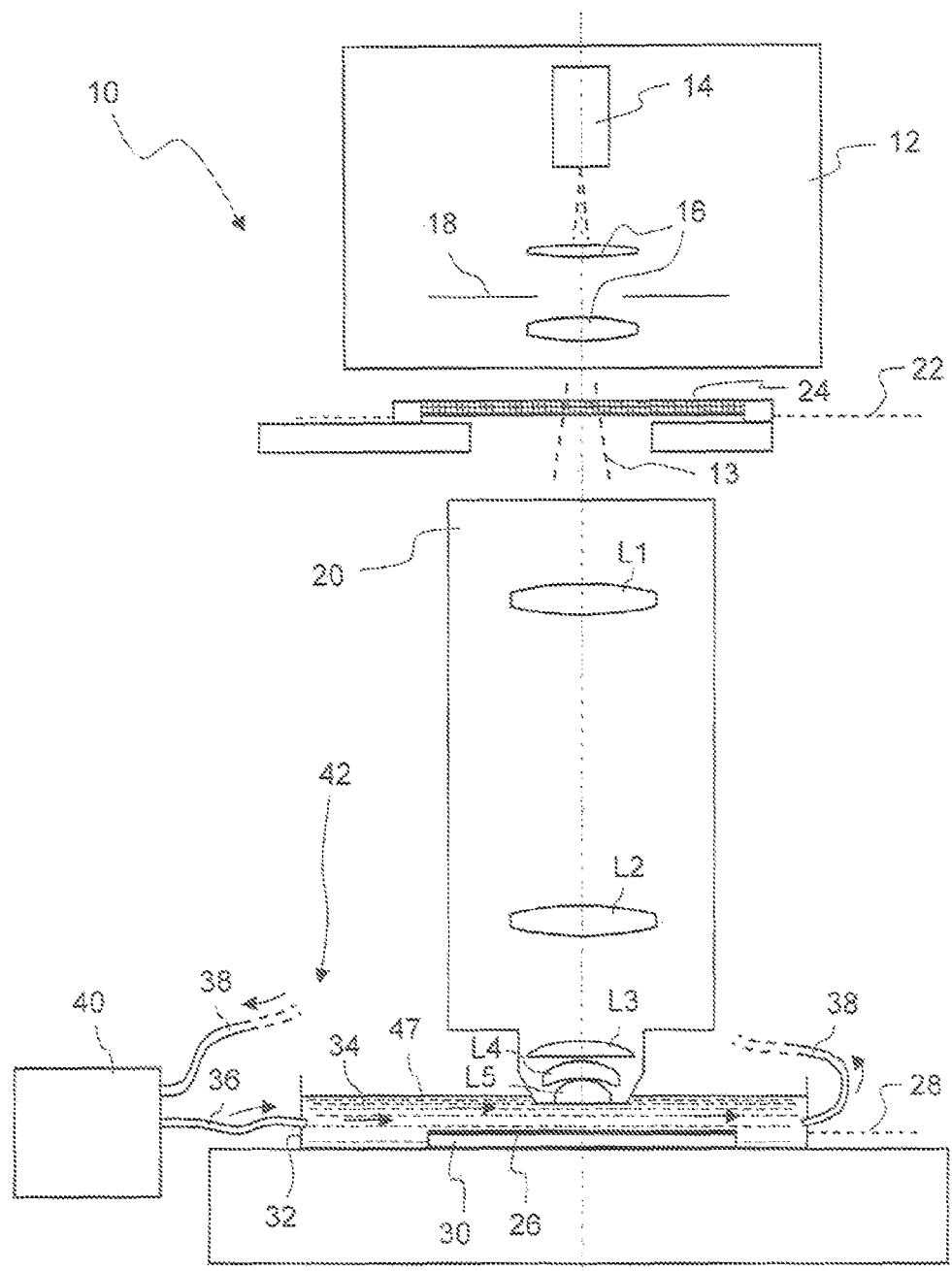
FIG. 1 shows a meridional section through a projection exposure apparatus according to the invention in a greatly simplified representation which is not to scale.

FIG. 1 shows a meridional section through a microlithographic projection exposure apparatus designated as a whole by 10 in a greatly simplified representation. The projection exposure apparatus 10 includes an illumination system 12 for generating projection light 13, which comprises a light source 14, illumination optics indicated at 16 and an aperture 18. In the embodiment illustrated the projection light 13 has a wavelength λ of 193 nm. The projection exposure apparatus 10 also includes a projection lens 20 containing a multiplicity of lenses, only some of which are indicated as examples in FIG. 1 for reasons of clarity, and which are denoted by L1 to L5. The projection lens 20 serves to image a mask 24 arranged in an object plane 22 of the projection lens 20 on a reduced scale on a photosensitive layer 26. The layer 26, which may consist, for example, of a photoresist, is arranged in an image plane 28 of the projection lens 20 and is applied to a carrier 30.

The carrier 30 is fixed to the bottom of a basin-like, upwardly open container 32 which is movable parallel to the image plane 28 (in a manner not illustrated in detail) by means of a traversing device. The container 32 is filled with an immersion liquid 34 to a level at which the last lens L5 of the projection lens 20 on the image side is immersed in the immersion liquid 34 during operation of the projection exposure apparatus 10. Instead of a lens, the last optical element of the projection lens 20 on the image side may be, for example, a plane-parallel terminal plate. The refractive index of the immersion liquid 34 approximately coincides with the refractive index of the photosensitive layer 26. In the case of projection light having a wavelength of 193 nm or 248 nm, high-purity deionized water, for example, is possible as the immersion liquid 34. With shorter wavelengths, such as 157 nm, perfluoropolyether (PEPE), for example, which is commercially available under trade names including Demnum® and Fomblin®, is suitable.

The container 32 is connected via an inlet pipe 36 and an outlet pipe 38 to a conditioning unit 40 in which elements including a circulation pump and a filter for cleaning the immersion liquid 34 are contained. The conditioning unit 40, the inlet pipe 36, the outlet pipe 38 and the container 32 together form an immersion device designated 42 in which the immersion liquid 34 circulates while being cleaned and maintained at a constant temperature. The absolute temperature of the immersion liquid 34 should be set as accurately as possible since imaging by the projection lens 20 can be impaired by focusing errors and image shell defects in the case of deviations from the reference temperature. Such imaging defects may in turn lead to a reduction in size of the process window available for an exposure.

Figure 2:
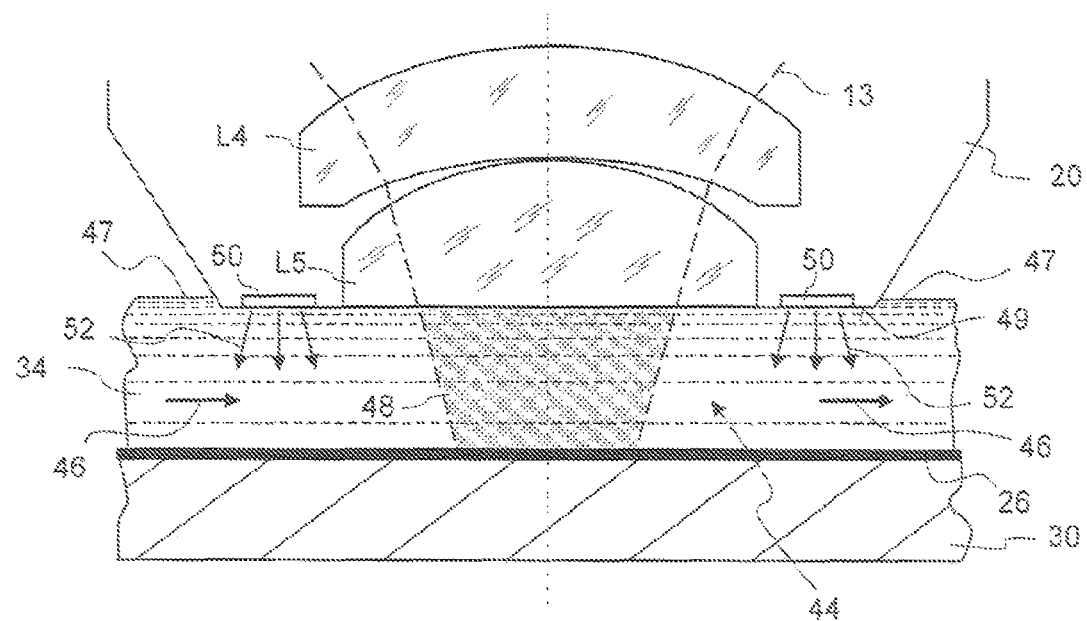
FIG. 2 shows an enlarged portion of the projection exposure apparatus illustrated in FIG. 1, in which a heat transfer element in the form of a heatable ring recessed in a housing of the projection lens on the image side can be seen.

FIG. 2 shows an enlarged portion of the projection exposure apparatus shown in FIG. 1 in which further details can be seen. In FIG. 2 a gap, referred to hereinafter as the immersion space, which remains between the last lens L5 of the projection lens 20 on the image side and the photosensitive layer 26, is designated 44. For reasons of clarity the height h of the immersion space 44, i.e. the axial distance between the last optical element of the projection lens 20 on the image side and the photosensitive layer 26, is greatly exaggerated as represented in FIG. 2 and in the other Figures; in fact, the height h is of the order of magnitude of only one or a few millimeters. In the embodiment illustrated, the immersion space 44 is completely filled with immersion liquid 34, which flows past the projection lens 20 in a circulation direction indicated by 46.

The projection light indicated by 13 enters the immersion liquid 34 via the last lens L5 on the image side and passes through said immersion liquid 34 in the zone of a partial volume 48 shaded grey in FIG. 2. The shape of the volume 48 depends on the numerical aperture NA of the projection lens 20 and on the geometry of the light field that is projected by the projection lens 20 onto the photosensitive layer 26. Because the immersion liquid 34 has an absorption—although a small one—for the projection light 13 of the given wavelength, a part of the projection light 13 is absorbed within the volume 48. The heat released in this way flows into the partial volume of the immersion space 44 surrounding the partial volume 48, since the temperature is lower therein, unless suitable countermeasures are taken.

The heat dissipated outwardly leads to the formation of a temperature gradient also within the volume 48. Because the refractive index of the immersion liquid 34 is temperature-dependent, this temperature gradient within the volume 48 causes a corresponding gradient in the refractive index. Such a gradient causes a refractive power which manifests in imaging defects that, if they exceed a certain degree, cannot be tolerated. This effect occurs especially strongly if the immersion liquid 34 in the immersion space 44 does not move or moves only slowly, since the heat produced by absorption in the volume 48 is not, or is only slightly, carried away by convection. For this reason immersion devices in which the immersion liquid does not circulate, or does not circulate permanently, with a high flow velocity are especially affected by these heat-induced effects.

In addition, the boundary surfaces between the immersion liquid 34 and a surrounding gas or gas mixture, which may be e.g. air or an inert gas such as helium or nitrogen, also contribute to the formation of a temperature gradient. At these boundary surfaces, which are designated 47 in FIGS. 1 and 2, the immersion liquid 34 evaporates which consumes vaporization heat. In this way the immersion liquid 34 is continuously cooled at the boundary surfaces 49, while the volume 48 is heated by the projection light 13.

In order to reduce or even completely avoid the imaging defects accompanying a temperature gradient a heat transfer element is provided. In the embodiment of FIGS. 1 and 2, this heat transfer element is realized as a heatable ring 50 that is recessed in the underside 49 of the projection lens 20 which is immersed in the immersion liquid 34. The heat emitted from the ring 50 is transmitted by thermal conduction to the immersion liquid 34, as is indicated by arrows 52 in FIG. 2. In this way the partial volume of the immersion space 44 surrounding the partial volume 48 is additionally heated, counteracting the formation of a temperature gradient. The geometry of the ring 50 may be adapted to the shape of the volume 48. In the case of a rectangular light field, for example, the heat transfer element 50 may also be configured as a rectangular ring. It is, of course, also possible to replace the continuous ring by a plurality of individual heat transfer elements distributed with corresponding geometry on the underside 49 of the projection lens 20.

Figure 3:
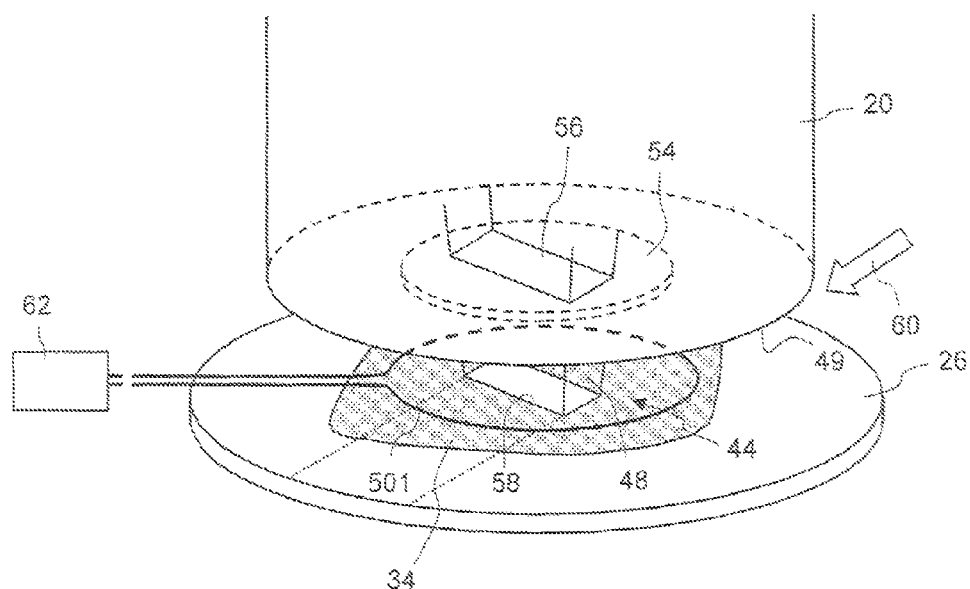
FIG. 3 is a perspective representation of an immersion space according to another embodiment of the invention in which the heat transfer element is a heating wire arranged inside the immersion space.
Figure 4:
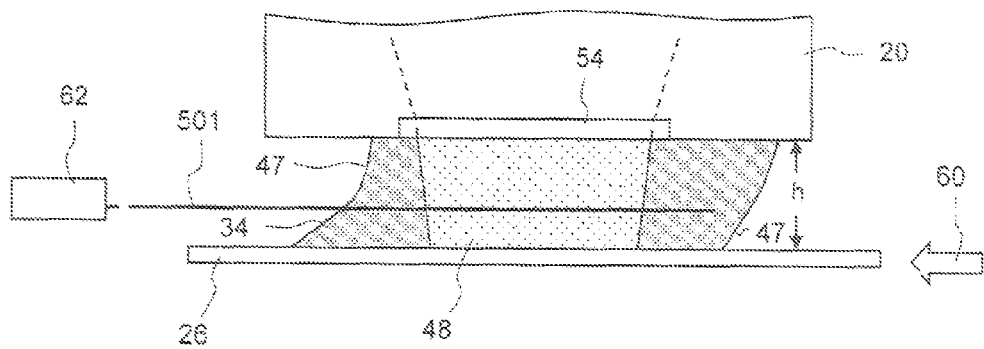
FIG. 4 shows an axial section through the immersion space illustrated in FIG. 3.

FIGS. 3 and 4 show a projection exposure apparatus according to another embodiment in a partial perspective representation and in axial section respectively. In this embodiment the immersion liquid 34 is not located in a container 32 but is retained in the immersion space 44 solely by adhesion forces. In the illustrated embodiment the last optical element of the projection lens 20 on the image side is not a lens but a plane-parallel terminal plate 54. Indicated thereon is a projection light beam denoted by 56 which has an approximately rectangular cross-section. After passing through the terminal plate 54 and the immersion liquid 34 located in the immersion space 44 below said terminal plate 54, the projection light beam 56 generates a rectangular light field 58 on the photosensitive layer 26.

In this embodiment the temperature gradient is even steeper than that shown in FIGS. 1 and 2, since the boundary surface 47 between the immersion liquid 34 and a surrounding gas, which boundary surface 47 is comparatively cool as a result of evaporation, is here located even closer to the volume 48. In addition, in this embodiment the immersion liquid 34 is not circulated, but remains for a prolonged period in the immersion space 44. In this case, a certain homogenization of the temperature distribution is provided only by mixing of the immersion liquid 34 as a result of a traversing motion 60, indicated by an arrow 60, by which the photosensitive layer 26 is moved past the projection lens 20 during an exposure.

To counteract the formation of a major temperature gradient, in the embodiment illustrated in FIGS. 3 and 4 heat is supplied to the immersion liquid 34 via an annular heating wire 501 that is surrounded by a chemically inert and electrically insulating sheath. The heating wire 501 is connected to a control unit 62 in which a battery for current supply and a control device are integrated. Said control unit 62 has the function of adjusting the calorific output of the heating wire 501 in accordance with a predefined value. Instead of the control device, a temperature control system which includes a temperature sensor for measuring the temperature of the immersion liquid 34 may be provided.

In the embodiment illustrated, the heating wire 501 is in the form of a loop placed around the volume 48 through which the projection light beam 56 passes, so that the immersion liquid 34 located outside the volume 48 can be uniformly heated by the heating wire 501. The heating wire 501 may also be arranged more tightly around the volume 48. Moreover, shapes of the heating wire 501 other than circular are, of course, envisaged in the context of the present application.

Figure 5:
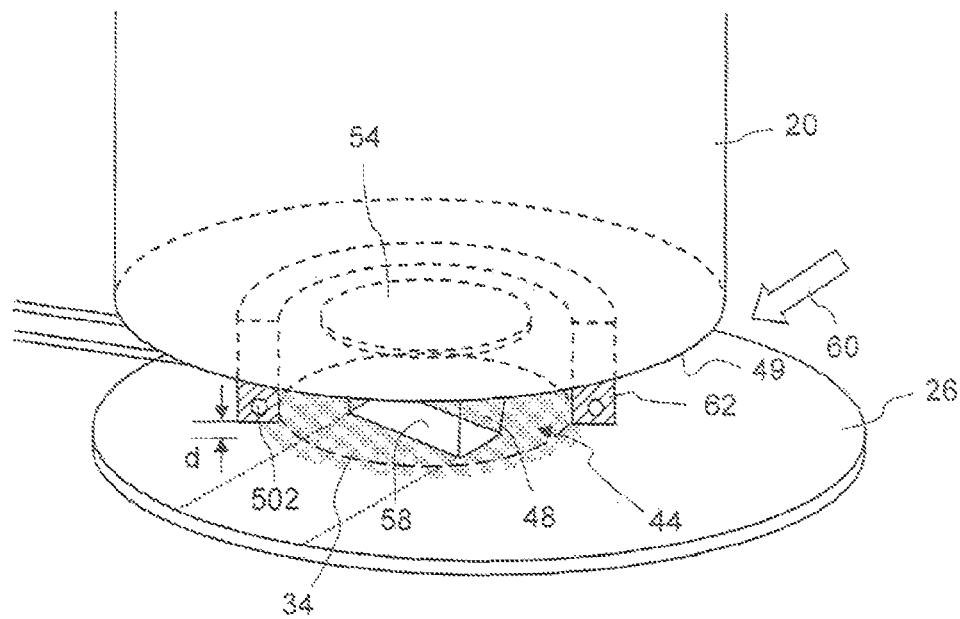
FIG. 5 is a representation corresponding to FIG. 3 according to a further embodiment of the invention in which the heat transfer element is integrated in a wall laterally delimiting the immersion space.

FIG. 5 shows a further embodiment based on the representation in FIG. 3, indicating how heat transfer elements may be configured to reduce the temperature gradient. In this embodiment the immersion space 44 is delimited laterally by a ring 62 fixed to the underside 49 of the projection lens 20. The ring 62 extends downwardly in the axial direction only so far that the photosensitive layer 26 can be moved past and below the ring 62 during a traversing movement 60. The ring 62 has the effect that, with relatively fast traversing movements 60, the immersion liquid 34 does not escape from the immersion space 44. In addition, the boundary surface 47 to the surrounding gas or gas mixture is considerably reduced, since the immersion liquid 34 can now evaporate only via a narrow gap of height d remaining below the ring 62.

To homogenize the temperature distribution, the ring 62 is heatable. For this purpose an annular conduit 502, in which a heating medium, e.g. heated water or hot air, can circulate is arranged in the lower part of the ring 62.

Figure 6:
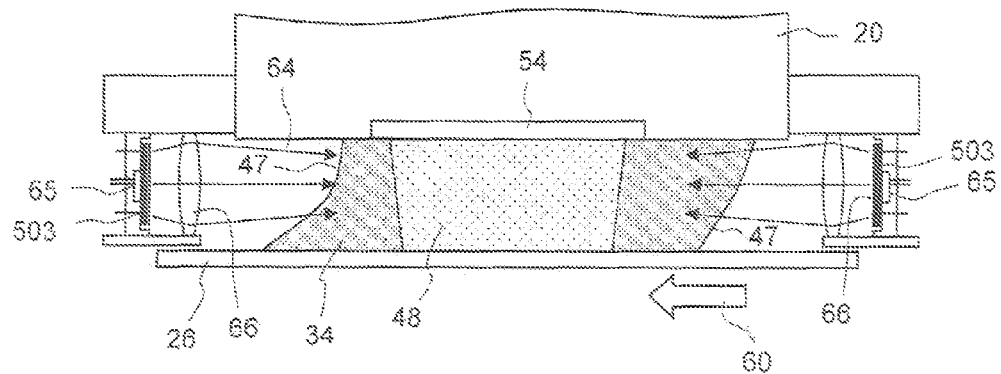
FIG. 6 is a representation corresponding to FIG. 4 according to a further embodiment of the invention in which the heat transfer elements are thermal radiators.

FIG. 6 shows in a partial axial sectional representation a projection exposure apparatus according to a further embodiment. In this case the heat transfer elements are realized as planar radiators 503 which are electrically heatable and are distributed around the perimeter of the projection lens 20. The planar radiators 503 have a black surface on their side facing towards the immersion liquid 34 and a mirror surface on the opposite side, so that thermal radiation is directed substantially only at the immersion liquid 34. When heated to temperatures of between approximately 40° C. and 80° C., the planar radiators 503 emit predominantly thermal radiation having wavelengths in the microwave range, for which water used as the immersion liquid 34 is highly absorptive. Alternatively, however, the heat transfer elements may be other components which emit electromagnetic radiation, e.g. semiconductor diodes or semiconductor lasers. Designated by 65 are thermal sensors with which the temperature of the planar radiators 503 can be measured.

Associated with each planar radiator 503 is a collecting lens 66 which focuses the thermal radiation generated by the planar radiators 503 and directs it at the immersion space 44. The immersion liquid 34 absorbs the thermal radiation predominantly in the area of the boundary surface 47 and is heated locally. In this way heat is generated precisely at the location in the immersion liquid 34 where it is lost through evaporation. The larger the absorption coefficient for the wavelength range of the thermal radiation, the more strongly is the heating concentrated on the area of the boundary surfaces 47.

In a practical inversion of the above-described mode of operation, the arrangement shown in FIG. 6 may also be used for cooling the immersion liquid 34. In this case it is necessary only to ensure that the planar radiators 503 are cooled, e.g. by means of Peltier elements. In this case the heat transfer is effected by thermal radiation from warmer zones of the immersion liquid 34 to the cooled planar radiators 503.

The arrangement illustrated in FIG. 6 can be further modified so that the planar radiators 503 are arranged inside the projection lens 20, in such a way that the thermal radiation emitted passes through the immersion liquid 34 in the axial direction through suitable exit windows. Such an arrangement may be considered particularly in the case of measuring devices, since then there is no danger that any short-wave spectral components of the thermal radiation present will contribute to exposing the photosensitive layer 26.

Figure 7:
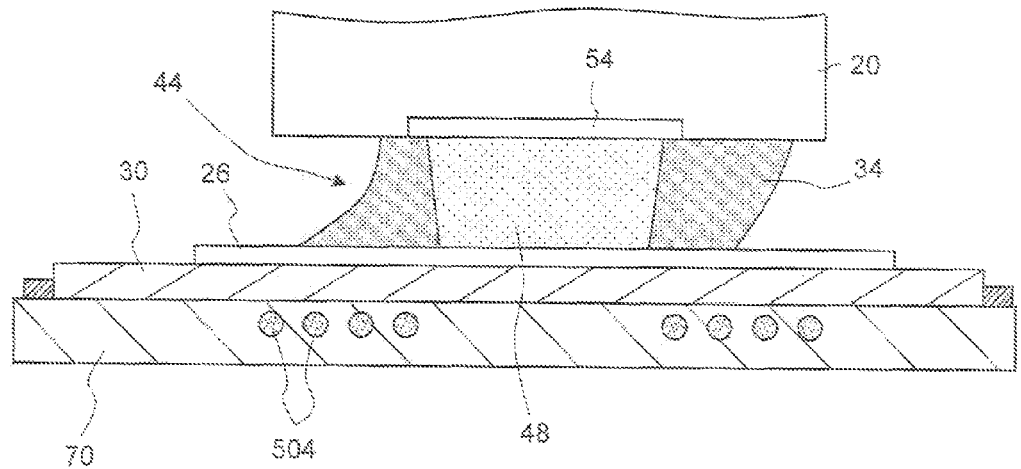
FIG. 7 is a representation corresponding to FIG. 4 according to yet another embodiment of the invention in which heat transfer elements are recessed in a wafer stage for fixing a wafer.

FIG. 7 shows a similar portion of a projection exposure apparatus according to another embodiment. Unlike FIGS. 4 and 6, FIG. 7 shows a wafer stage 70 on which the carrier 30 of the photosensitive layer 26 is attached. Incorporated into the wafer stage 70 are heat transfer elements which, in the embodiment illustrated, are realized as conduits 504 disposed parallel to one another. When a hot fluid, e.g. water, flows through the conduits 504, the zones of the carrier 30 and of the photosensitive layer 26 located above the conduits 504 are heated. From there the heat passes into the immersion liquid 34 located above said zones. Because the conduits 504 are offset laterally with respect to the axial position of the partial volume 48, the heat transfer is limited substantially to the partial volume in the immersion space 44 surrounding the partial volume 48. In this way the immersion liquid 34 in the immersion space 44 is heated almost uniformly, which prevents the formation of major temperature gradients.

Figure 8:
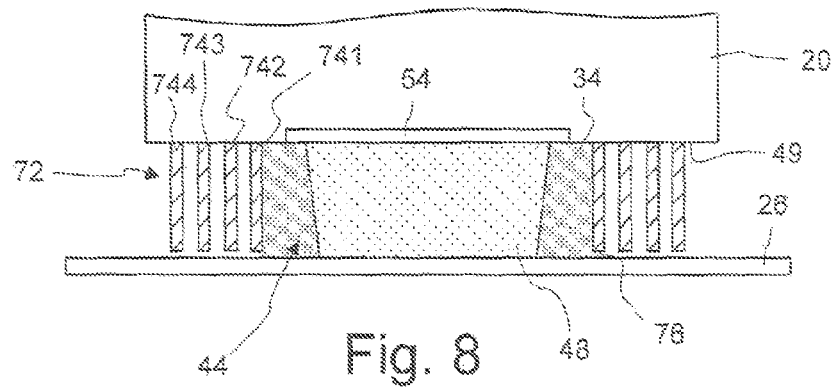
FIG. 8 is a representation corresponding to FIG. 4 according to another aspect of the invention in which an evaporation barrier surrounds the immersion space laterally to reduce evaporation.

FIG. 8 shows in an axial section a portion of a projection exposure apparatus in which no heat transfer elements are present. In this case homogenization of temperature distribution within the immersion liquid 34 is achieved in that an evaporation barrier designated as a whole by 72 is fixed to the underside 49 of the projection lens 20. The evaporation barrier 72 comprises a total of four concentrically arranged rings 741, 742, 743 and 744, which delimit the immersion space 44 laterally, i.e. perpendicularly to the optical axis. The rings 741 to 744 have, in the axial direction, a width which is such that the free ends of the rings 741 to 744 are spaced from the photosensitive layer 26, as is also similarly the case with the embodiment shown in FIG. 5. In this way the photosensitive layer cannot be damaged by the evaporation barrier 72. Immersion liquid 34 located inside the immersion space 44 is prevented by adhesion forces from escaping through the gap 76 remaining between the ring 741 and the photosensitive layer 26.

Through the staggered arrangement of the rings 741 to 744 it is also prevented that a surrounding gas or gas mixture flows around the gap 76 and thereby promotes evaporation.

On the contrary, evaporated immersion liquid 34 remains predominantly in the gaps between the rings 741 to 744, whereby the vapor pressure of the immersion liquid is increased in that location. Because evaporation decreases as the vapor pressure of the surrounding gas increases, an evaporation-inhibiting effect is additionally achieved in this way. This in turn has the result that only a comparatively small temperature gradient can form inside the immersion space 44.

Figure 9:
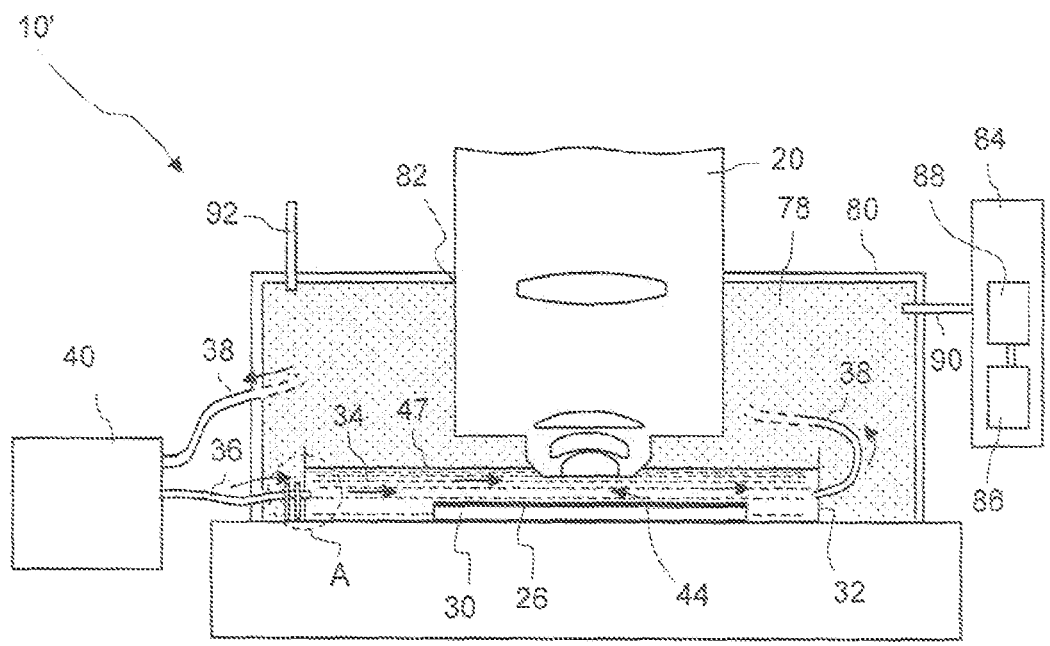
FIG. 9 shows a partial meridional section through a projection exposure apparatus according to a further aspect of the invention in which a saturated vapor phase of the immersion liquid is located above the immersion liquid to reduce evaporation.

FIG. 9 shows a portion of a projection exposure apparatus 10' similar to that shown in FIG. 1. In the case of the projection exposure apparatus 10', however, the container 32 in which the immersion liquid 34 is located is contained by a chamber 78 sealed all round in a gas-tight manner. The chamber 78 is formed substantially by a hood-like cover 80 which has an opening 82 through which the projection lens 20 passes through the cover 80.

In addition, the projection exposure apparatus 10' includes a supply unit 84 in which elements including a reservoir 86 for immersion liquid 34 and an evaporator 88 are housed. The supply unit 84 has the function of introducing immersion liquid in the vapor phase into the chamber 78 in order to increase the vapor pressure therein. For this purpose immersion liquid withdrawn from the reservoir 86 is evaporated in the evaporator 88 and fed into the chamber 78 via a conduit 90. The vapor phase of the immersion liquid can be discharged from the chamber 78 in a valve-controlled manner via an outlet 92.

Because of the increased vapor pressure inside the chamber 78, only a small amount of immersion liquid 34 evaporates at the boundary surface 47 between the immersion liquid 34 in the liquid phase and in the vapor phase. When the saturation vapor pressure is reached in the chamber 78 at the temperature prevailing therein, precisely as much immersion liquid 34 evaporates at the boundary surface 47 as is condensed inversely from the surrounding vapor phase. Therefore, as the saturation vapor pressure is reached in the chamber 78, no evaporation heat is consumed that cools off the immersion liquid 34 located in the container 32. In this way a similar effect is obtained as with the embodiment shown in FIG. 8, but without the provision of an evaporation barrier 72. The projection exposure apparatus 10' therefore makes it possible to conduct immersion liquid 34 through the immersion space 44 in a closed circulation.

Figure 10:
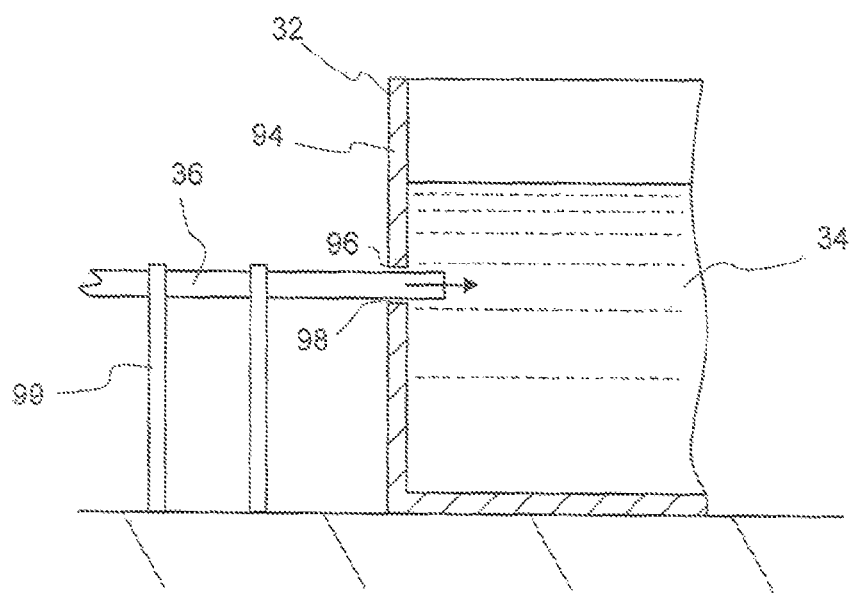
FIG. 10 shows a portion of the projection exposure apparatus illustrated in FIG. 9 in which a floating fixing of an inlet pipe is shown.

FIG. 10 shows an enlarged portion A of the projection exposure apparatus 10' illustrated in FIG. 9. In FIG. 10 a wall 94 of the container 32 can be seen, through which the inlet pipe 36 for the immersion liquid 34 passes. For this purpose an opening 96 through which the inlet pipe 36 passes into the interior of the container 32 is provided in the wall 94. The dimensions of the opening 96 are so selected that a circumferential gap 98 that the immersion liquid 34 can penetrate remains between the inlet pipe 36 and the wall 94. On the other hand, the gap 98 is so narrow that no immersion liquid 34 can escape from the container 32 through the gap 98. In this way the inlet pipe 36, which is held by supports 99, is mounted so as to "float" in fluid in the wall 94 of the container 32. As a result, vibration of the pipe 36 which may be produced, for example, by flow turbulence in the inlet pipe or by a pump in the processing unit 40, cannot be transmitted to the container 32. The above-described shock-isolated mounting of inlet and outlet pipes can be of significance, in particular, for measuring devices.

Figure 11:
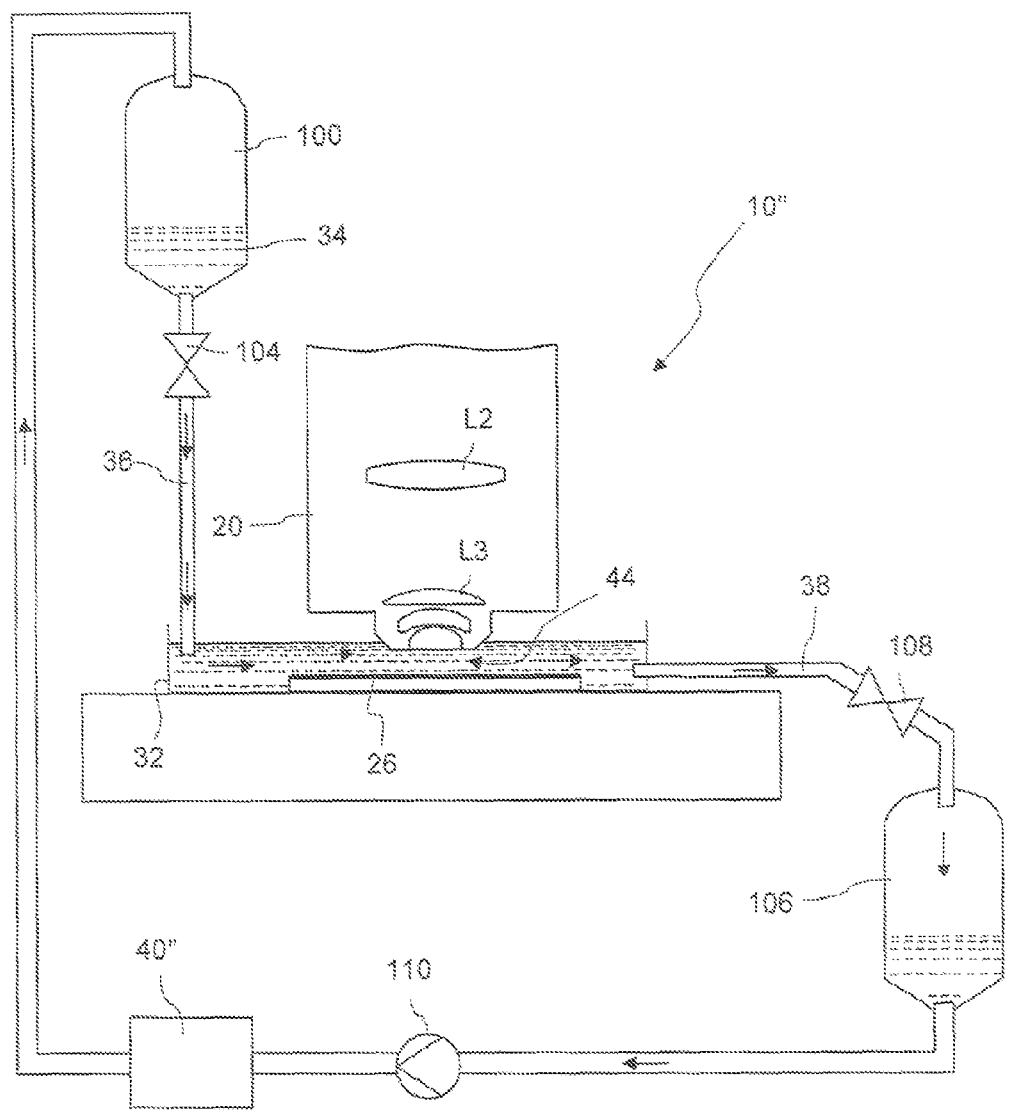
FIG. 11 is a representation based on FIG. 9 of a projection exposure apparatus according to yet a further aspect of the invention in which the immersion liquid is circulated through the influence of gravity.

FIG. 11 illustrates schematically a portion of another embodiment of a projection exposure apparatus, denoted as a whole by 10". In the projection exposure apparatus 10", to avoid shocks immersion liquid 34 is not conducted into and through the container 32 by means of a pump, but only by gravity. For this purpose a reservoir 100 for immersion liquid 34 is arranged above the immersion space 44. Immersion liquid 34, controlled by a valve 104, can be conducted from the reservoir 100 into the container 32. Periodic fluctuations in the flow velocity and vibrations caused thereby, which generally cannot be completely avoided with the use of pumps, do not occur with the projection exposure apparatus 102.

In this embodiment the outlet pipe 38 from the container 32 is connected to an intercepting tank 106 in which immersion liquid 34 is collected after passing through a second valve 108. From there the immersion liquid is returned by means of a pump 110 to the reservoir 100 via the conditioning unit 40. Because the pump 110 is decoupled from the immersion liquid 34 in the container 32 via the reservoir 100 and the intercepting tank 108, fluctuations in flow velocity generated by the pump 110 are confined to the pipe system between the intercepting tank 106 and the reservoir 100.

Another possibility of avoiding shocks produced by pumps consists in circulating the immersion liquid 34 in the container 32 only during projection pauses. The containers 100 and 106 shown in FIG. 11 can then be dispensed with.

Figure 12:
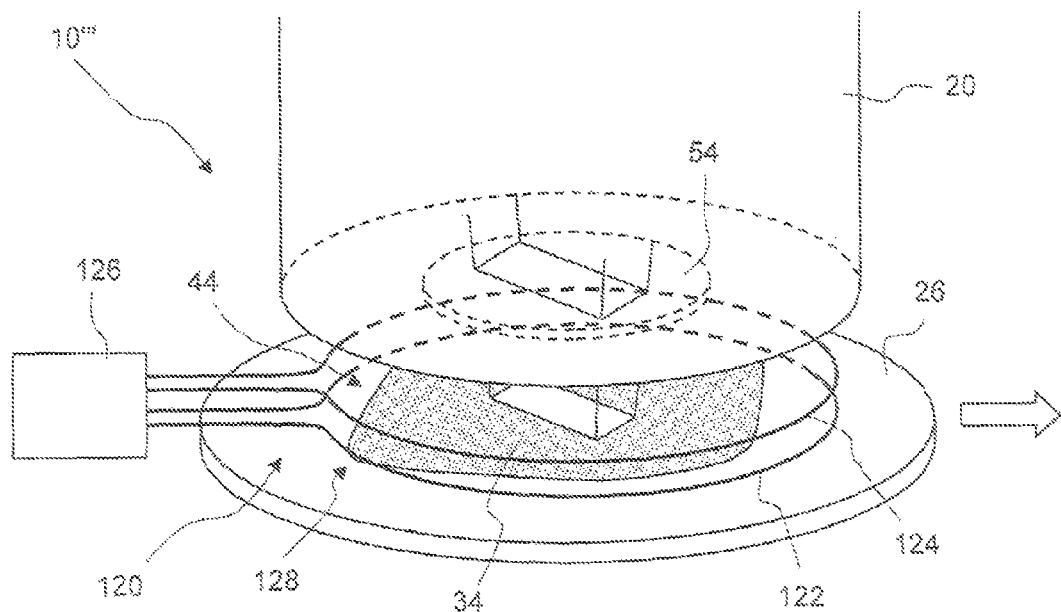
FIG. 12 is a representation corresponding to FIG. 3 of a further embodiment of the invention in which a detector for detecting laterally escaping immersion liquid is provided.
Figure 13:
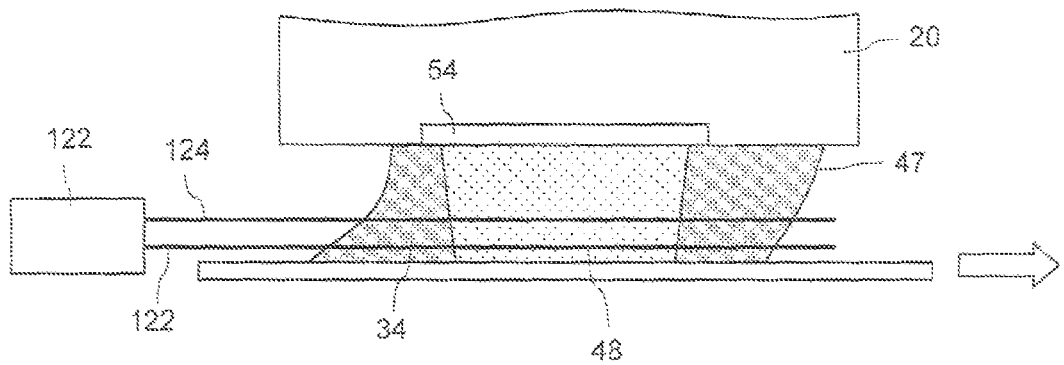
FIG. 13 shows an axial section through the immersion space illustrated in FIG. 12.

FIGS. 12 and 13 show a projection exposure apparatus 10''' according to a further embodiment in a perspective representation and in an axial section respectively. The projection exposure apparatus 10''' includes a detector, denoted as a whole by 120, with which undesired escaping of immersion liquid 34 from the immersion space 44 can be detected. For this purpose the detector 120 has two conductive loops 122, 124 arranged parallel to one another in the axial direction and connected to a measuring circuit 126.

The two conductive loops 122, 124 form a capacitor the capacitance of which depends on factors including the dielectric material located between the conductive loops 122, 124. If, for example, the immersion liquid is deionized water and the surrounding gas is air, the difference of dielectric constants is approximately 80. If immersion liquid 34 from the immersion space 44 enters the gap between the conductive loops 122, 124, as is indicated at 128, the dielectric constant of the medium present between the conductive loops 122, 124 is locally increased at that location. The accompanying rise in the capacitance of the capacitor formed by the conductive loops 122, 124 is detected by the measuring circuit 126. If a predefined threshold is exceeded the measuring circuit 126 can, for example, generate a signal which indicates that immersion liquid has passed outside the area defined by the conductive loops 122, 124.

The above embodiments have been discussed in relation to projection exposure apparatuses. However, they are transferable, with minor modifications as appropriate, to measuring devices with which the optical imaging characteristics of projection lenses can be determined. Such measuring devices generally include a test optics component which is arranged, in place of the support 30 for the photosensitive layer 26, on the image side of the projection lens 20. This test optics component may be, for example, a mirror, a diffraction grating, a CCD sensor or a photosensitive test layer. Such measuring devices frequently also include separate light sources which then replace the illumination system of the projection exposure apparatus.

Some of the above-described embodiments and aspects of the invention can be used especially advantageously with certain measuring devices. With regard to a Shearing interferometer this is the case, for example, for the variants shown in FIGS. 3 to 5 and the floating mounting of pipes shown in FIG. 10; the circulation making use of gravitation illustrated in FIG. 11 is especially advantageous with a Moiré interferometer.

Figure 14:
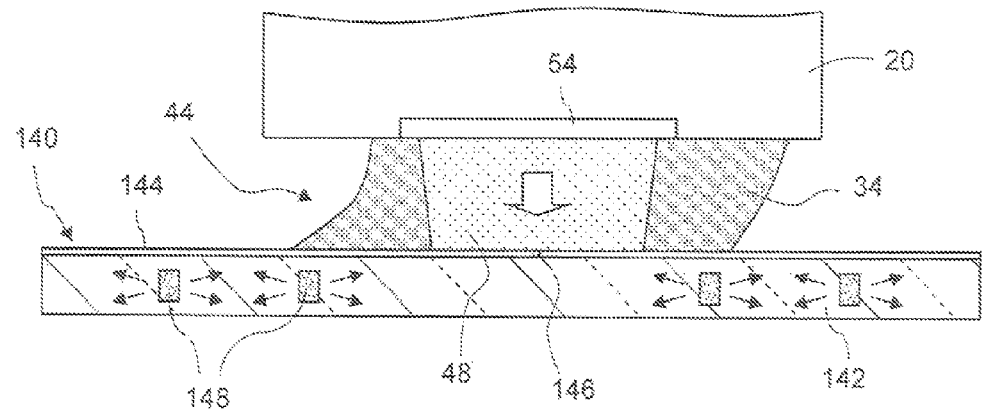
FIG. 14 shows an axial section through an immersion space of a point diffraction interferometer according to a first embodiment.

FIG. 14 illustrates schematically a pinhole mask of a point diffraction interferometer (PDI) in an axial section. Such point diffraction interferometers and the pinhole masks necessitated thereby are known per se in the prior art, so that elucidation of further details thereof can be omitted. The pinhole mask 140 consists of a glass body 142 to which a semitransparent layer 144 is applied. Located at approximately the centre of the pinhole mask 140 is a small pinhole opening 146 in the semitransparent layer 144.

To be able to heat the immersion liquid 34 in the immersion space 44 located above said semitransparent layer 144 in the partial volume surrounding the partial volume 48 exposed to the measuring light, conduits 148 through which flows a fluid heating medium, e.g. heated water, are incorporated in the glass body 142. In this way the periphery of the glass carrier 142 is heated uniformly, whereby the temperature of the immersion liquid 34 located above same is increased locally.

Figure 15:
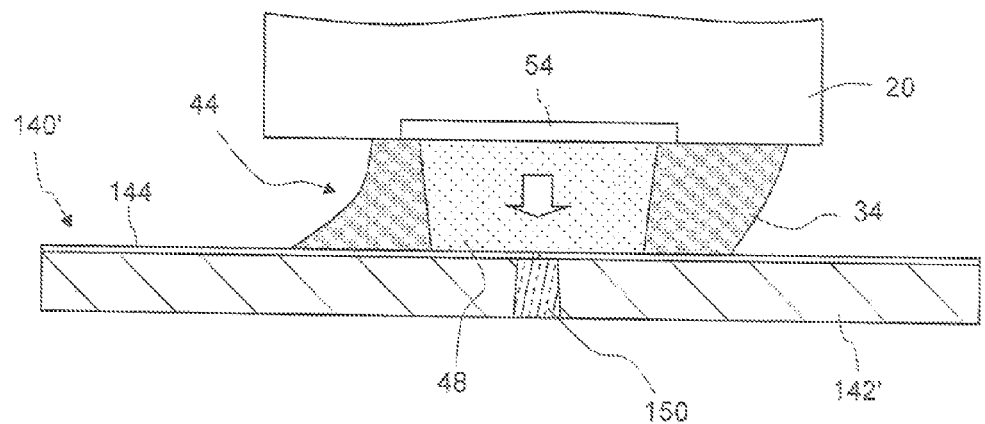
FIG. 15 shows an axial section corresponding to FIG. 14 according to a second embodiment of a point diffraction interferometer according to the invention.

FIG. 15 shows another embodiment of a pinhole mask, denoted by 140', in a representation corresponding to FIG. 14. In this embodiment the pinhole mask 140 consists of a metal carrier 142' at the centre of which a glass insert 150 is incorporated. This glass insert 150, which may have the form, for example, of a truncated cone, is so dimensioned that the measuring light can pass through the glass insert 150 without reaching the surrounding metal of the metal carrier 142'.

Because the volume 48 through which the measuring light passes predominantly borders the metal carrier 142' via the semitransparent layer 144 and only a small part thereof borders the glass insert 150, heat released in the volume 48 by absorption of measuring light is efficiently dissipated via the metal carrier 142'. In this way the high thermal conductivity of the metal carrier 142' contributes to permitting only a small temperature gradient within the immersion space 44.

Figure 16:
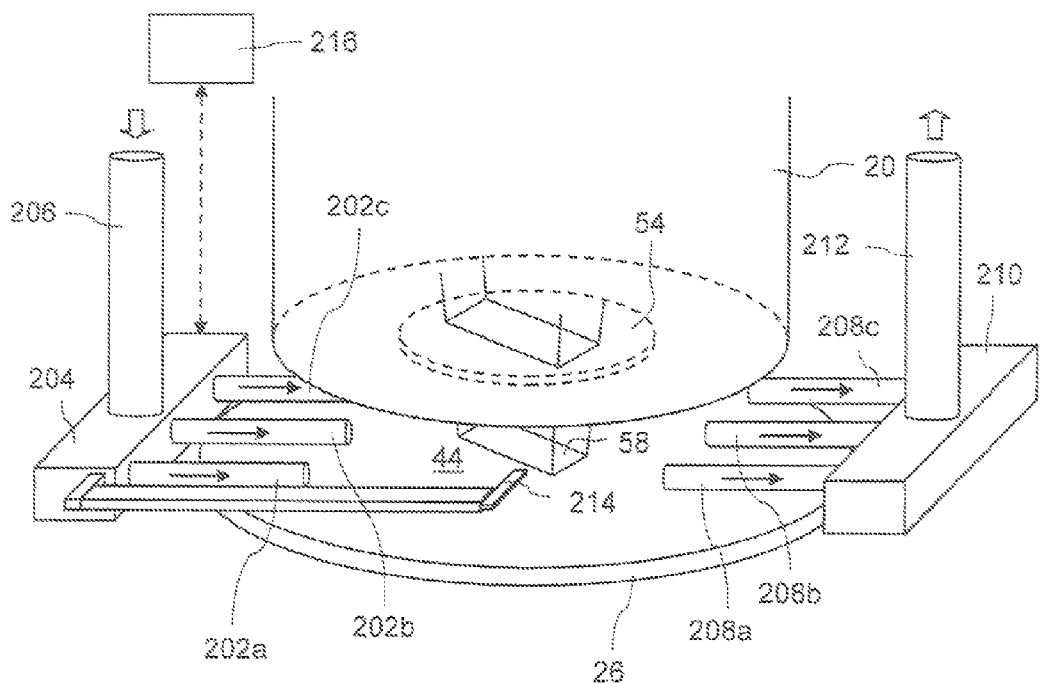
FIG. 16 shows in a partial perspective representation a projection exposure apparatus according to still another embodiment if the invention in which a plurality of inlets and outlets are provided in the vicinity of the immersion space.

FIG. 16 shows in a partial perspective representation a projection exposure apparatus according to still another embodiment. In this embodiment immersion liquid (not shown) is applied to the immersion space 44 formed between the terminal plate 54 of the projections lens 20 and the photosensitive layer 26 with the help of a plurality of inlets 202a, 202b, 202c. The inlets 202a, 202b, 202c are connected to a distributor 204 which is supplied with immersion liquid via a supply line 206.

On the opposite side of the inlets 202a, 202b, 202c a plurality of outlets 208a, 208b, 208c is arranged such that they reach into the immersion space 44. The outlets 208a, 208b, 208c are connected to an immersion liquid collector 210 through which immersion liquid sucked in via the outlets 208a, 208b, 208c and collected in the collector 210 is drained away through a drain line 212.

During operation of the projection exposure apparatus immersion liquid 34 is constantly or intermittently supplied via the inlets 202a, 202b, 202c and sucked off with the help of the outlets 208a, 208b, 208c. Thus there is a constant or frequent exchange of immersion liquid filling the immersion space 44.

The projection exposure apparatus further comprises a temperature sensor 214 which is arranged such that it reaches into the immersion space 44. The temperature sensor 214 and the distributor 204 for the inlets 202a, 202b, 202c are connected to a control unit 216. An additional cap may be provided that substantially seals off the immersion space 44 from the outer atmosphere, as is known in the art. Such caps are sometimes referred to as "shower hood".

Figure 17:
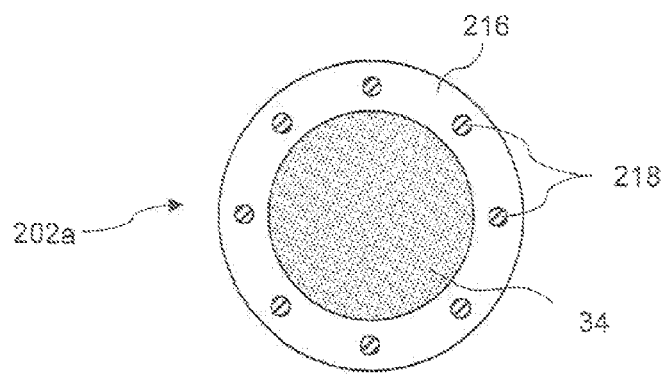
FIG. 17 a cross section through an inlet shown in FIG. 16.

FIG. 17 shows a radial cross section through the inlet 202a. The cross sections of the other inlets 202b, 202c are, in the embodiment shown, identical. The inlet 202a comprises an inlet wall 216 which is formed by a flexible hose or a rigid tube, for example. Within the inlet wall 216 a plurality of elongated heating elements 218 extend along the longitudinal direction of the inlet 202a. The heating element 218 may be formed by heating wires or channels through which heated or cooled water or another heat carrier fluid is guided. By appropriately controlling the heating elements 218, it is possible to change the temperature of the immersion liquid leaving the inlet 202a and running into the immersion space 44.

In a preferred embodiment each inlet 202a, 202b, 202c can be controlled independently at least as far as the heating elements 218 are concerned. Alternatively or additionally, the flux (i.e. flow rate) of immersion liquid running through the inlet 202a, 202b, 202c may be independently set in the distributor 204 under the control of the control unit 216.

It is thus possible to locally change the temperature of the immersion liquid within the immersion space 44 by selectively controlling the heating elements 218 and/or the flow rate for each inlet 202a, 202b, 202c. From this it becomes clear that the spatial resolution of this temperature control of the immersion space 44 depends on the number and arrangement of inlets 202a, 202b, 202c provided around the immersion space 44. By appropriately selecting these parameters it is possible to achieve a homogenous temperature distribution at a target temperature, or at least a rotationally symmetric temperature distribution having a target temperature gradient, within the partial volume of the immersion space 44 that is exposed to projection light.

As a matter or course, there are various alternatives for the inlets 202a, 202b, 202c as far as the temperature control is concerned. For example, the heating elements 218 may extend through the inlet wall 216 like a helix, or they may be configured as a mesh woven of a conducting wire.

In the embodiment shown the temperature sensor 214 is part of a control loop that makes it possible to keep the temperature within the immersion space 44, or at least the temperature in the vicinity of the temperature sensor 214, at a constant value. Preferably the maximum variations of the temperature of the immersion liquid 34 should not exceed 5 mK, and even better 2 mK, during a duration of 1 minute. Over longer time periods, for example 15 minutes, these limits may be considerably relaxed up to a factor 10. These values ensure that the temperature varies slowly enough to be able to correct residual imaging aberrations by means further explained below.

Certain parameters that detrimentally affect the temperature stability may be quantitatively determined beforehand, either by simulation or by experiment. For example, a simulation model may be developed that makes it possible to predict the amount of immersion liquid that evaporates during the operation of the apparatus, and how this evaporation affects the temperature of the immersion liquid within the partial volume of the immersion space 44 that is exposed to projection light. With the help of the controllable inlets 202a, 202b, 202c this expected temperature variation may be compensated for. Thus the temperature may be maintained at a constant or only slowly varying value even if no closed control loop comprising the temperature sensor 214 is provided.

In FIG. 16 the temperature sensor 214 is illustrated as a single element that reaches into the immersion space 44. However, the temperature measurement of a complex 3D temperature distribution is a difficult task, and often it is not easy to accurately determine the 3D temperature distribution on the basis of measurements performed only at a small number of measurement points.

Figure 18:
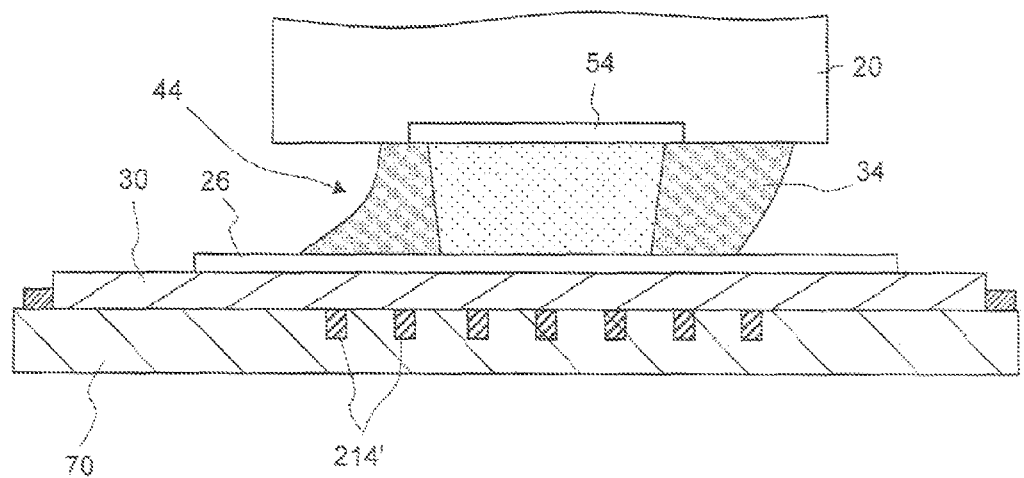
FIG. 18 is a representation similar to FIG. 7 according to yet another embodiment of the invention in which a temperature sensor is received in a wafer stage.

Another alternative for measuring the temperature of the immersion liquid 34 is shown in the cross section of FIG. 18. In this embodiment a matrix of temperature sensors 214' is received within a wafer stage 70 for positioning the carrier 30 relative to the projection lens 20. Since the carrier 30 is usually made of a material having a large heat conductivity, the temperature distribution of the immersion liquid 34 over the area of the matrix of temperature sensors 214' may be measured by the temperature sensors 214' with high accuracy.

Temperature sensors may also be provided at or in the outlets 208a, 208b, 208c.

The temperature of the immersion liquid may also be determined more remotely from the immersion space 44 on the basis of optical measurements. For example, the refractive index of the immersion liquid, and thus its temperature, may be determined by interferometric measurements that measure phase deviations of measurement light propagating through the immersion liquid 34 substantially parallel to the photosensitive layer 26. Another possibility is to measure infrared radiation emitted by the immersion liquid. If a cap ("shower hood") is provided, this cap may contain a window which is transparent for this infrared radiation.

Instead of or in addition to the control of the outlets 202a, 202b, 202c on the basis of measured temperature data, certain imaging properties of the projection lens 20 may be measured and directly fed to the control unit 216. For example, alignment marks arranged on the carrier 30 are usually optically detected. If the alignment marks are completely immersed in immersion liquid, the temperature and thus the refractive index of the immersion liquid will also have an impact on the optical detection of the alignment marks. The information obtained from the optical detection equipment may be used to control the temperature of the immersion liquid.

The above mentioned methods and devices to measure the temperature of the immersion liquid may be used also in conjunction with embodiments in which no means for selectively varying the temperature in a partial volume of the immersion space are provided, as is the case in the embodiments described above. A global change of the temperature of the immersion liquid may be achieved, for example, by mixing two immersion liquids having different temperatures with a carefully selected mixing ratio, or by inductive heating of a single inlet.

If no means are provided to achieve a homogenous or at least rotationally symmetric temperature distribution, or if significant residual imaging aberrations remain in spite of the application of such means, it may be necessary to apply methods for correcting the residual imaging aberrations. To this end many of the known manipulators for correcting imaging aberrations may be advantageously used. For example, the last lens element and/or other lens elements of the projection lens 20 may be displaced along or tilted with respect to the optical axis, or such lens elements may be deformed. If the temperature distribution of the immersion liquid is rotationally symmetric, the deformations of the lens element(s) should be rotationally symmetric as well.

Other manipulators may vary the gas pressure in a confined volume through which projection light propagates.

It is also possible to design the projection lens 20 such that temperature variations occurring in the last lens element result in a compensation of the effects caused by a temperature change in the immersion liquid. This principle exploits the fact that the last lens element is thermally coupled to the immersion liquid, and thus a self-correcting effect may be produced by appropriately designing the properties of the last lens elements.

Manipulators may be preferably used in those cases in which short term temperature fluctuations of the immersion liquid have to be compensated for. This is due to the fact that a temperature fluctuation of the immersion liquid immediately results in optical aberrations that require instant correction, whereas it usually takes some time to change the temperature of the immersion liquid using one of the methods and devices described above. In a preferred embodiment a fine correction of residual imaging aberrations is therefore carried out even during the exposure operation. Larger aberrations are corrected in exposure pauses by changing the temperature of the immersion liquid.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. An apparatus, comprising:
   an illumination system;
   a projection lens configured to image an object in an object plane into an image plane, the projection lens comprising:
      a housing; and
      a plurality of optical elements, one of the optical elements being a last optical element on an image side of the projection lens; and
   an immersion liquid between the projection lens and the image plane, the immersion liquid defining an interface between the immersion liquid and a surrounding gas, the interface extending between a bottom surface of the housing and the image plane,
   wherein:
      the interface directly contacts the bottom surface of the housing;
      the interface directly contacts the image plane;
      the immersion liquid contacts the last optical element in a contact area which is planar and through which light passes during use of the apparatus;
      only one side of the last optical element contacts a liquid;
      the bottom surface of the housing surrounds the last optical element and is coplanar with the contact area; and
      the apparatus is a microlithographic projection exposure apparatus.

2. The apparatus of claim 1, wherein the last optical element is a plane parallel plate.

3. The apparatus of claim 1, wherein the object is a reticle.

4. The apparatus of claim 3, further comprising a stage configured to hold a photosensitive material in the image plane.

5. The apparatus of claim 1, wherein the immersion liquid comprises deionized water.

6. The apparatus of claim 1, further comprising a heat transfer element configured to transfer an amount of heat to or from the immersion liquid: a) at the interface between the immersion liquid and a surrounding gas; or b) within the immersion liquid.

7. The apparatus of claim 6, wherein the heat transfer element contacts the immersion liquid during use of the apparatus.

8. The apparatus of claim 6, wherein the heat transfer element is disposed a distance from the immersion liquid so that, during use of the apparatus, heat is exchanged via thermal radiation between the heat transfer element and the immersion liquid.

9. The apparatus of claim 6, wherein the heat transfer element comprises a heating wire or a Peltier element.

10. A method, comprising:
   providing the apparatus of claim 1;
   using the illumination system to illuminate a reticle in the object plane of the projection lens; and
   using the projection lens to image a portion of the reticle onto a photosensitive material in the image plane of the projection lens.

11. The apparatus of claim 1, wherein the liquid contacts the only one side of the last optical element only in a region where the only one side of the last optical element is planar.

12. An apparatus, comprising:
   an illumination system;
   a projection lens configured to image an object in an object plane into an image plane, the projection lens comprising:
      a housing; and
      a plurality of optical elements, one of the optical elements being a last optical element on an image side of the projection lens; and
   an immersion liquid between the projection lens and the image plane, the immersion liquid defining an interface between the immersion liquid and a surrounding gas, the interface extending between a bottom surface of the housing and the image plane,
   wherein:
      the interface directly contacts the bottom surface of the housing;
      the interface directly contacts the image plane;
      the immersion liquid contacts the last optical element in a contact area which has a planar portion through which light passes during use of the apparatus;
      only one side of the last optical element contacts a liquid;
      the bottom surface of the housing surrounds the last optical element and is coplanar with the contact area; and
      the apparatus is a microlithographic projection exposure apparatus.

13. The apparatus of claim 12, wherein the last optical element is a plane parallel plate.

14. The apparatus of claim 12, wherein the object is a reticle.

15. The apparatus of claim 14, further comprising a stage configured to hold a photosensitive material in the image plane.

16. The apparatus of claim 12, wherein the immersion liquid comprises deionized water.

17. The apparatus of claim 12, further comprising a heat transfer element configured to transfer an amount of heat to or from the immersion liquid: a) at the interface between the immersion liquid and a surrounding gas; or b) within the immersion liquid.

18. The apparatus of claim 17, wherein the heat transfer element contacts the immersion liquid during use of the apparatus.

19. The apparatus of claim 17, wherein the heat transfer element is disposed a distance from the immersion liquid so that, during use of the apparatus, heat is exchanged via thermal radiation between the heat transfer element and the immersion liquid.

20. The apparatus of claim 17, wherein the heat transfer element comprises a heating wire or a Peltier element.

21. A method, comprising:
   providing the apparatus of claim 12;
   using the illumination system to illuminate a reticle in the object plane of the projection lens; and
   using the projection lens to image a portion of the reticle onto a photosensitive material in the image plane of the projection lens.

22. The apparatus of claim 12, wherein the liquid contacts the only one side of the last optical element only in a region where the only one side of the last optical element is planar.

* * * * *

UNITED STATES PATENT AND TRADEMARK OFFICE
CERTIFICATE OF CORRECTION

| | |
|---|---|
| PATENT NO. | : 9,436,095 B2 |
| APPLICATION NO. | : 13/682474 |
| DATED | : September 6, 2016 |
| INVENTOR(S) | : Albrecht Ehrmann et al. |

It is certified that error appears in the above-identified patent and that said Letters Patent is hereby corrected as shown below:

In the Specification

Column 6, Line 24, after "therewith", insert -- which --.

Column 16, Line 37, delete "or" and insert -- of --.

Signed and Sealed this
Thirty-first Day of January, 2017

Michelle K. Lee
*Director of the United States Patent and Trademark Office*